United States Patent [19]
Snell et al.

[11] 4,259,740
[45] Mar. 31, 1981

[54] SEQUENTIAL DETECTION SYSTEM

[75] Inventors: James L. Snell; Albert D. Darby, Jr., both of Palm Bay; Raymond F. Cobb, Melbourne Beach, all of Fla.

[73] Assignee: Harris Corporation, Melbourne, Fla.

[21] Appl. No.: 18,329

[22] Filed: Mar. 7, 1979

[51] Int. Cl.³ .............................................. H04B 1/66
[52] U.S. Cl. ...................................... 375/99; 455/266;
455/161; 370/84; 375/103; 375/120; 375/94
[58] Field of Search ................ 325/63, 321, 322, 323,
325/324, 332, 427, 469, 470; 328/133; 329/50,
122, 124; 455/68, 70, 71, 266, 161; 179/15.55 R;
370/84; 375/97, 99, 94, 102, 120, 76, 103

[56] References Cited
U.S. PATENT DOCUMENTS

| | | | |
|---|---|---|---|
| 2,954,465 | 9/1960 | White | 325/427 |
| 3,325,809 | 6/1967 | Meranda et al. | 325/324 |
| 3,633,108 | 1/1972 | Kneuer | 325/323 |

Primary Examiner—Benedict V. Safourek
Attorney, Agent, or Firm—Craig & Antonelli

[57] ABSTRACT

In a communication system, a signal detection and acquisition system, which is capable of locating and phase-locking onto a narrow-band signal in a large frequency uncertainty region in a short period of time, employs the following series of operations:
(a) sequentially search for signal power in adjacent frequency bins into which the frequency uncertainty region is divided,
(b) find the widest loop filter bandwidth at which the receiver phase lock loop can lock onto a transmitted signal,
(c) sweep the loop carrier reference oscillator and phase lock onto the transmitted signal,
(d) convert the bandwidth of the loop filter at which phase lock was acquired to the bit rate bandwidth, and
(e) bit synchronize and begin data recovery.

The time required to locate and acquire the signal during the above series of operations is effectively minimized through the use of a sequential detection process which compares signal strength to upper and lower thresholds and rapidly makes decisions based upon a relationship between signal strength and these thresholds.

88 Claims, 7 Drawing Figures

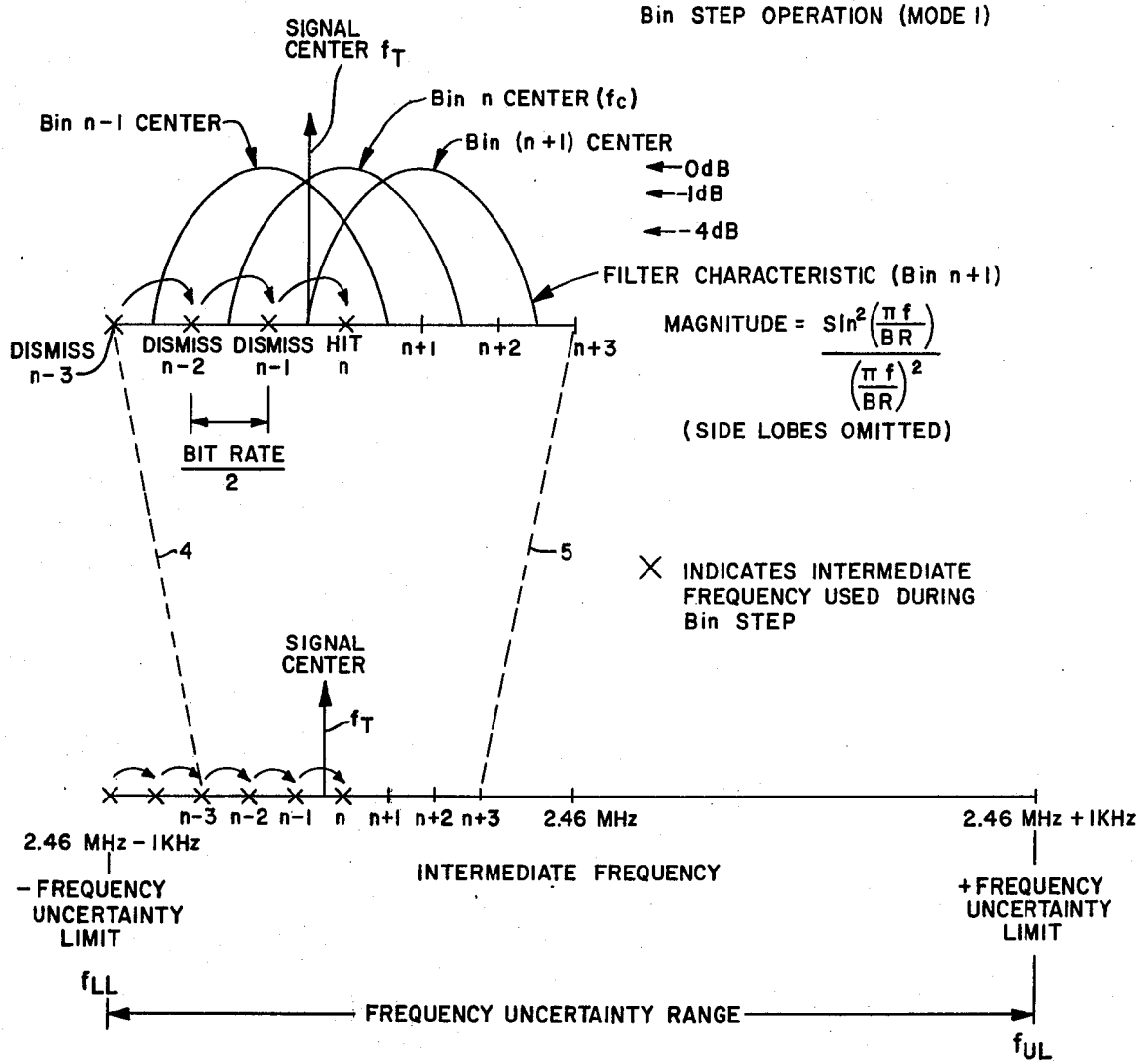

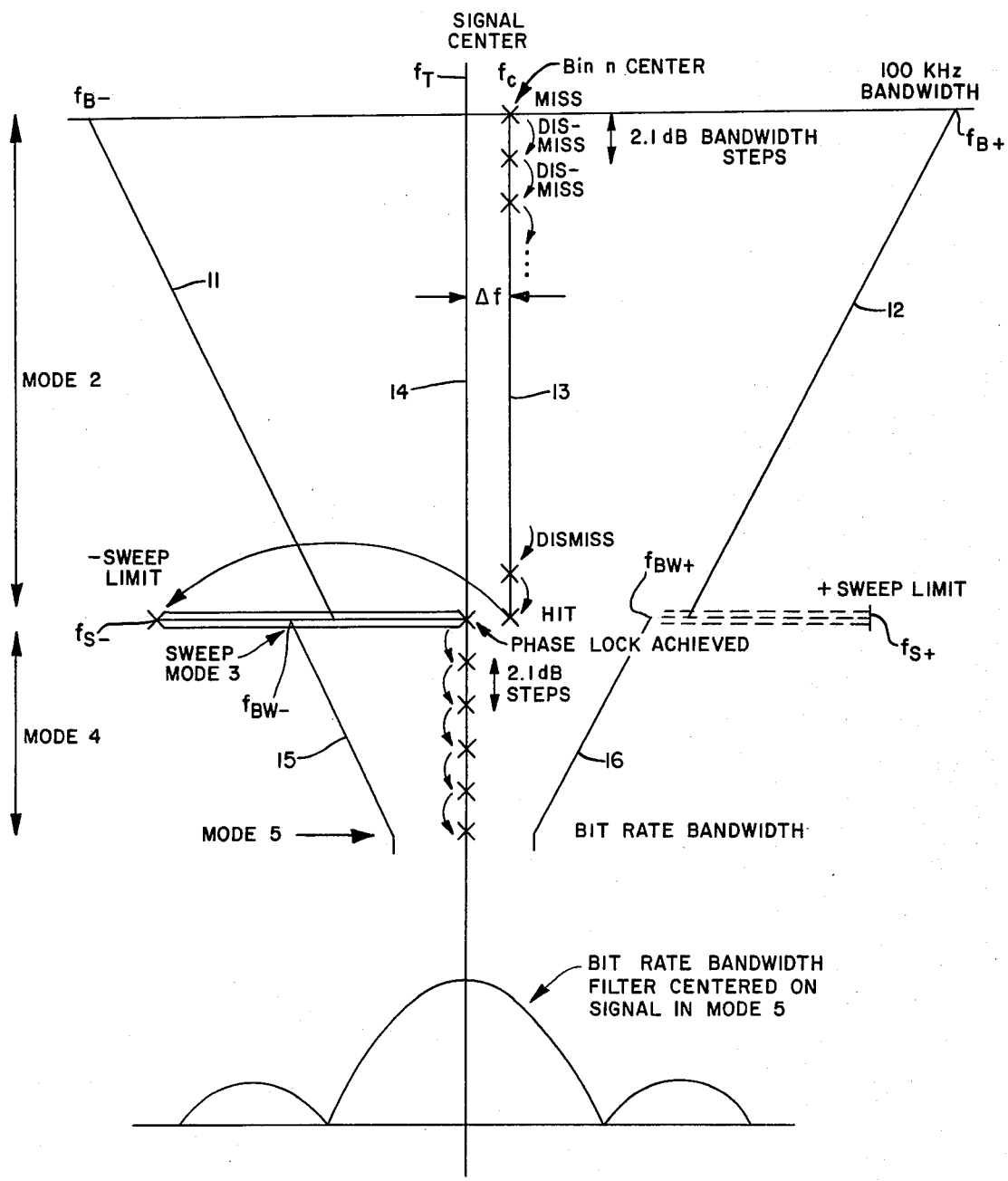

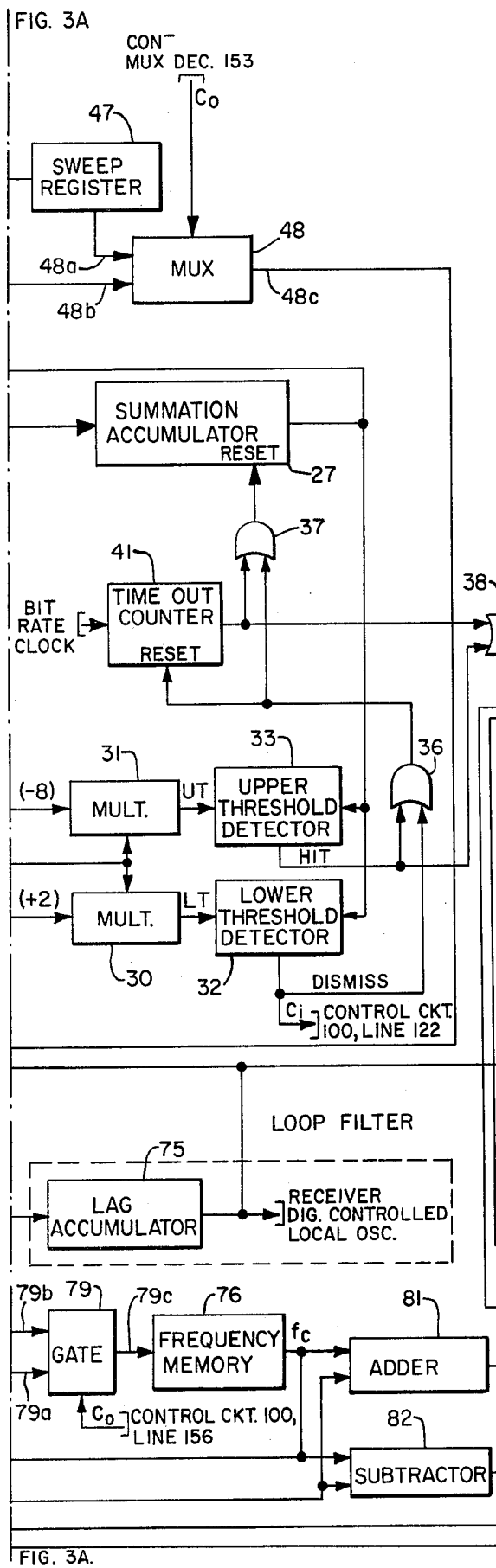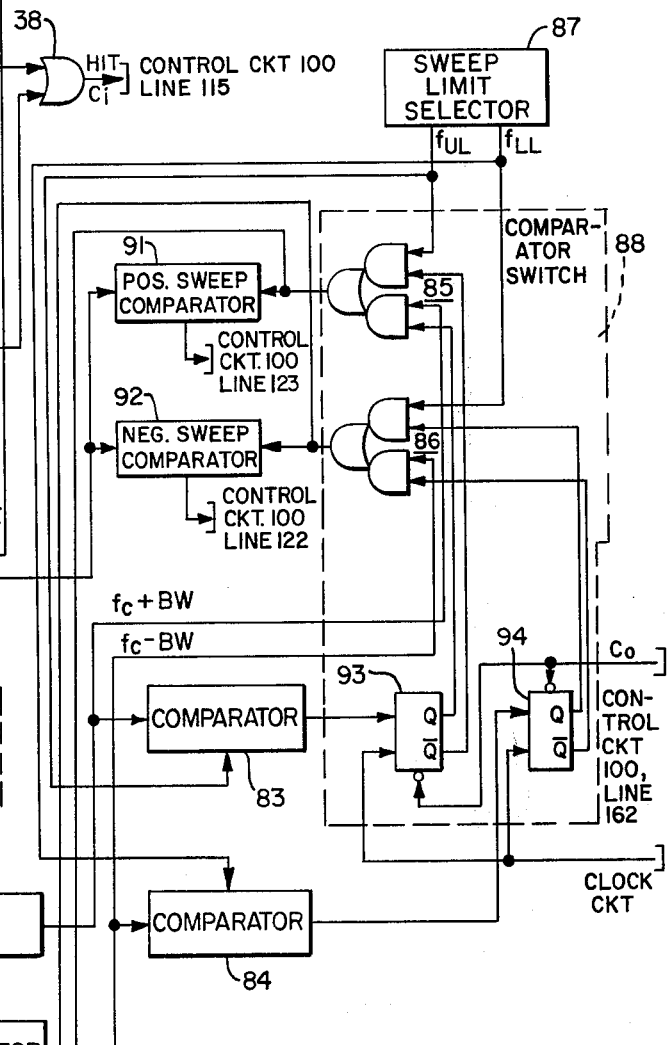
FIG. 3A.
FIG. 3B.

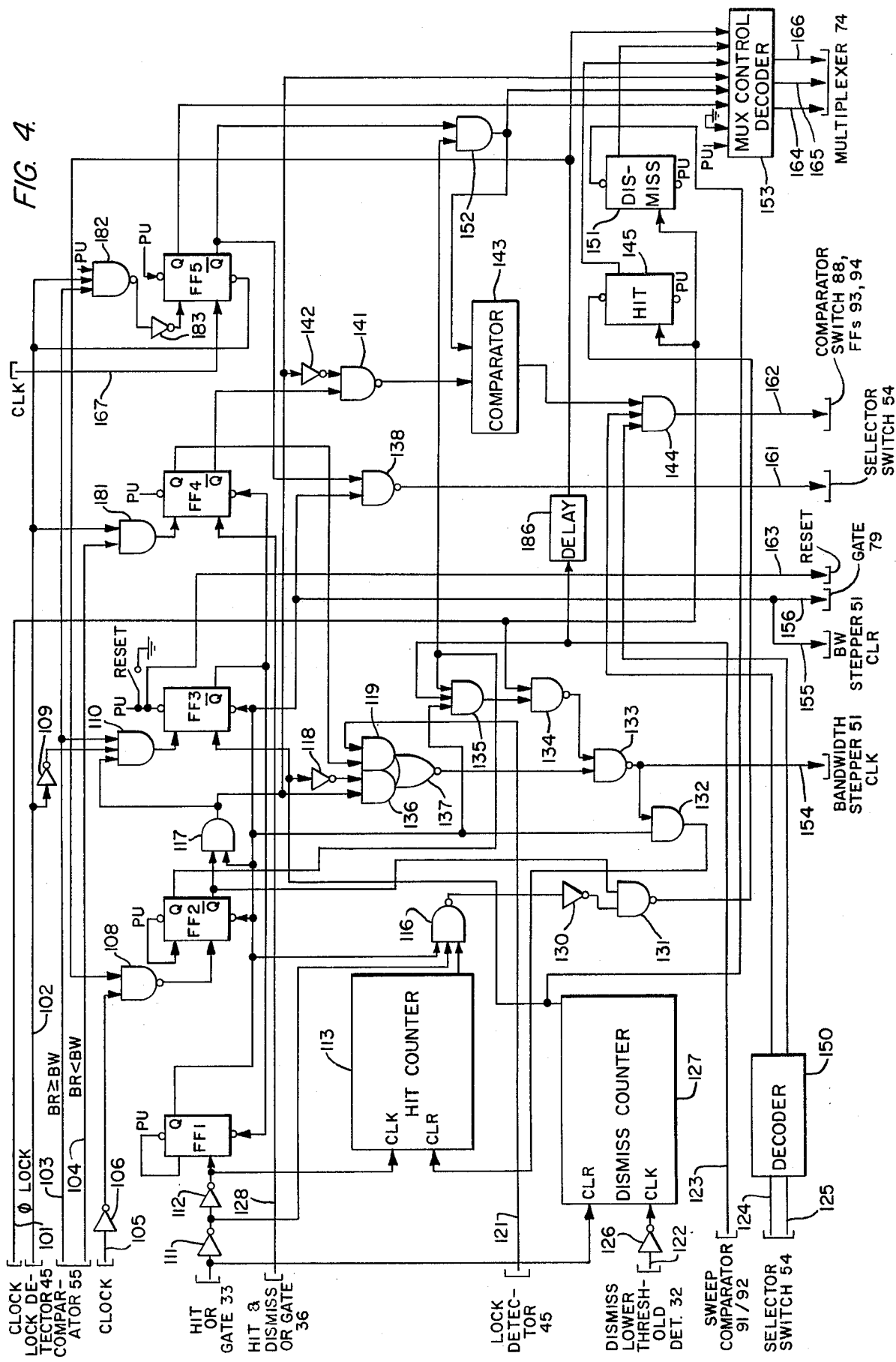

FLOWCHART OF ACQUISITION MODES

SEQUENTIAL DETECTION SYSTEM

FIELD OF THE INVENTION

The present invention relates in general to the field of communication systems and is particularly directed to an apparatus and technique for rapidly acquiring a narrow bandwidth signal located somewhere within a large spectrum of frequency uncertainty.

BACKGROUND OF THE INVENTION

For the purpose of recovering information contained in a signal transmitted from one station to another, it is necessary at the receiving station to tune or lock the receiver to the frequency of the transmitted signal so that the demodulation process will accurately track the signal of interest. Where the information to be recovered is contained in a narrow bandwidth signal, the center frequency of which is unknown, the ability of the receiver to recover the transmitted signal will depend upon its initial task of locating the signal and then locking onto the previously unknown center frequency. While bandpass filtering schemes are sometimes useful in this respect, they are not always reliable, particularly where the frequency uncertainty region is so wide as to effectively reduce the signal-to-noise ratio of the output of the filter to an unacceptable level.

SUMMARY OF THE INVENTION

In accordance with the present invention, there is provided a digital data recovery scheme through which a narrow bandwidth signal, that is situated somewhere within a wide range of frequency uncertainty, is located and then locked onto in a relatively short period of time. For this purpose, the inventive system employs a sequential detection process that is carried out during a series of signal search and acquisition steps. Briefly, in accordance with the sequential detection process, for a prescribed frequency bandwidth, the received signal is applied to a detector and an offset number is subtracted from its output. The result of the subtraction is integrated during a test interval for up to a limited or maximum period of time. The output of the integrator is continuously compared with upper and lower thresholds. If, at any time during the test interval, the integrator output exceeds the upper threshold, a positive output of "hit" (indicative of either presence of signal or proper bandwidth, as will be described more fully below) is immediately declared, and the test interval is thereby terminated. On the other hand, if, at any time during the test interval, the integrator output drops below the lower threshold, a negative output or "dismiss" (indicative of absence of signal or too wide a bandwidth, as will be described more fully below), is immediately declared and, as in the case of a "hit", the test interval is thereby terminated. Should the integrator output remain between the upper and lower threshold for the entirety or maximum duration of the test interval, a positive output or "hit" is declared. For any of these decision steps, the procedure is repeated a selected number of times for verification purposes.

During an initial search for the presence of a narrowband signal that may be located anywhere within a range of frequency uncertainty, the sequential detection process is used to identify the presence of signal, in successively monitored frequency subregions or bins, in order that the range of frequency uncertainty can be scanned for signal presence in the shortest possible time. Thereafter, the sequential detection process is applied to a bandwidth search and signal lock or acquisition procedure, to again significantly reduce the time required to finally lock onto a transmitted narrowband signal the presence of which has been initially and rapidly detected during the frequency bin scan.

In more detail, during the scan of adjacent frequency bins into which the range of frequency uncertainty has been subdivided, the received signal for a respective frequency bin is applied to a detector, an offset number is subtracted from its output, and the result of the subtraction is integrated during a test interval for up to a limited or maximum period of time. The output of the integrator is continuously compared with upper and lower thresholds. If, at any time during the test interval, the integrator output exceeds the upper threshold, a positive output or "hit" is immediately declared and the test interval is thereby terminated. The declaration of a "hit" during the frequency bin scan indicates that the particular frequency bin being examined contains a narrowband signal of interest. On the other hand, if, at any time during the test interval, the integrator output drops below the lower threshold, a negative output or "dismiss" is declared and the particular bin being examined is identified as containing no signal of interest. Upon the declaration of a "dismiss", the test interval is terminated and the bin search proceeds to the next bin. Should the integrator output remain between the upper and lower thresholds for the entirety of the test interval, a positive output or "hit" is declared. For either decision process, the signal is reexamined a selected number of times as a verification procedure.

Once a frequency subregion or bin has been identified through the sequential detection process as containing a transmitted signal, a bandwidth search procedure is carried out, again using the basic sequential detection process described above, in order to determine the widest loop filter bandwidth at which phase lock of a located signal can be achieved.

The loop filter bandwidth itself is established as a small fraction of the bit rate clock that is used to control the operation rate of the signal analyzing circuitry employed in accordance with the present invention. In particular, separate in-phase (I) and quadrature (Q) accumulators receive quantized input signals, integrate their respective channel inputs, and dump the integrated signal channel values through absolute value circuits to an adder for analysis in accordance with the sequential detection process. The bandwidth of the I and Q accumulators is controlled by the bit rate clock and is equal to their dump rate. Since the bandwidth of the loop filter is established as a fraction of this dump rate, bandwidth expansion is accomplished by increasing the dump rate. The system demodulator operates as if it is demodulating a higher bit rate signal; thus, the loop bandwidth increases proportionally with the accumulator dump rate or bandwidth, albeit a small fraction of the dump rate. Since the term bandwidth is a general term and may cover different parametric ranges for different system components, (for example the loop filter "bandwidth" is a small fraction of the "bandwidth" or "dump rate" of the I and Q channel accumulators), it should be understood that unless specifically related to a particular portion of the system, the term is used in its general sense. It should also be noted that in the description of the invention to follow, rather than discuss system operation in terms of the bandwidth of the loop filter itself, the explanation presented will be, for the most part, in terms of the integrate and dump rate, which is controlled by appropriate clock pulse timing signals used in the digital signal processing circuitry. Since the loop filter bandwidth is always a fraction of the bandwidth of the I and Q channel accumulators, i.e. their integrate and dump rate, or more simply dump rate, description in terms of the dump rate may be understood to correspond to a description of the system in terms of (proportional) loop filter bandwidth.

During the bandwidth search, the bandwidth of the loop filter is initially assumed to occupy a maximum frequency range spaced about the center frequency of the selected bin. The dump rate of the I and Q accumulators is correspondingly increased to a value that will yield the appropriate fractional dump rate as the loop filter bandwidth. In accordance with the sequential detection process, the received signal is applied to a detector and an offset number is subtracted from its output. The result of the subtraction is integrated during a test interval for up to a limited or maximum period of time. The output of the integrator is continuously compared with upper and lower thresholds. If, at any time during the test interval, the integrator output drops below the lower threshold, a negative output or "dismiss" is declared and the test interval is thereby terminated. The declaration of a "dismiss" indication means that the assumed loop filter bandwidth or fractional bit rate is too large for phase lock to be achieved. The bit rate of dump rate of the I and Q accumulators and receiver bandwidth is decreased by a prescribed amount and the sequential detection procedure is repeated. If, on the other hand, at any time during the test interval, the integrator output exceeds the upper threshold, a positive output or "hit" is immediately declared and the test interval is thereby terminated. The declaration of a "hit" during bandwidth search indicates that the bandwidth is acceptable for achieving phase lock. Should the integrator output remain between the upper and lower thresholds for the entirety or maximum duration of the test interval, a positive output or "hit" is declared. For either decision process, the signal is reexamined a selected number of times as a verification procedure.

Upon the bit rate of the I and Q accumulators and the receiver bandwidth having been decreased to a value at which phase lock can be achieved, a carrier reference frequency generator is swept across the assumed fractional dump rate or loop filter bandwidth in order to phase-lock onto the transmitted signal that is located within this bandwidth region. The accumulator dump rate is then converted to the bit rate of the incoming signal received by the data recovery circuitry, so that bit synchronization and data demodulation can proceed.

As contrasted to conventional detector arrangements, the sequential detection process that is used in accordance with the frequency sweep and bandwidth search steps of the present invention is adaptive to signal strength, which permits the inventive tracking scheme to rapidly acquire a narrow bandwidth signal. By adaptive is meant the manner in which the acquisition circuitry responds to signal strength. For strong signals, weak, or absent signals, the decision is fast; only marginal signals and signal-like noise prolong the decision, so that the invention enjoys an advantage in recovery rate over conventional frequency scanning and acquisition systems.

BRIEF DESCRIPTION OF THE DRAWINGS

FIG. 1 is a graphic plot of the manner in which a frequency uncertainty range is divided into subregions or bins that are used to define the characteristics of the receiver loop filter for signal power measurement purposes;

FIG. 2 is a graphic illustration of the application of the sequential detection process during the successive bandwidth search steps through which a narrowband signal is acquired or finally locked onto in accordance with the present invention;

FIGS. 3A and 3B are general schematic block diagrams of the signal processing and evaluation circuitry used in the system in accordance with the present invention;

FIG. 4 is a detailed illustration of the combinational logic of which the control circuit employed in conjunction with the system shown in FIGS. 3A and 3B is comprised;

FIG. 4A is a state chart showing the various logic states of control flip-flops of the control circuit shown in FIG. 4 for the various modes of operation of the system shown in FIGS. 3A and 3B.

DETAILED DESCRIPTION

Figure 3A:
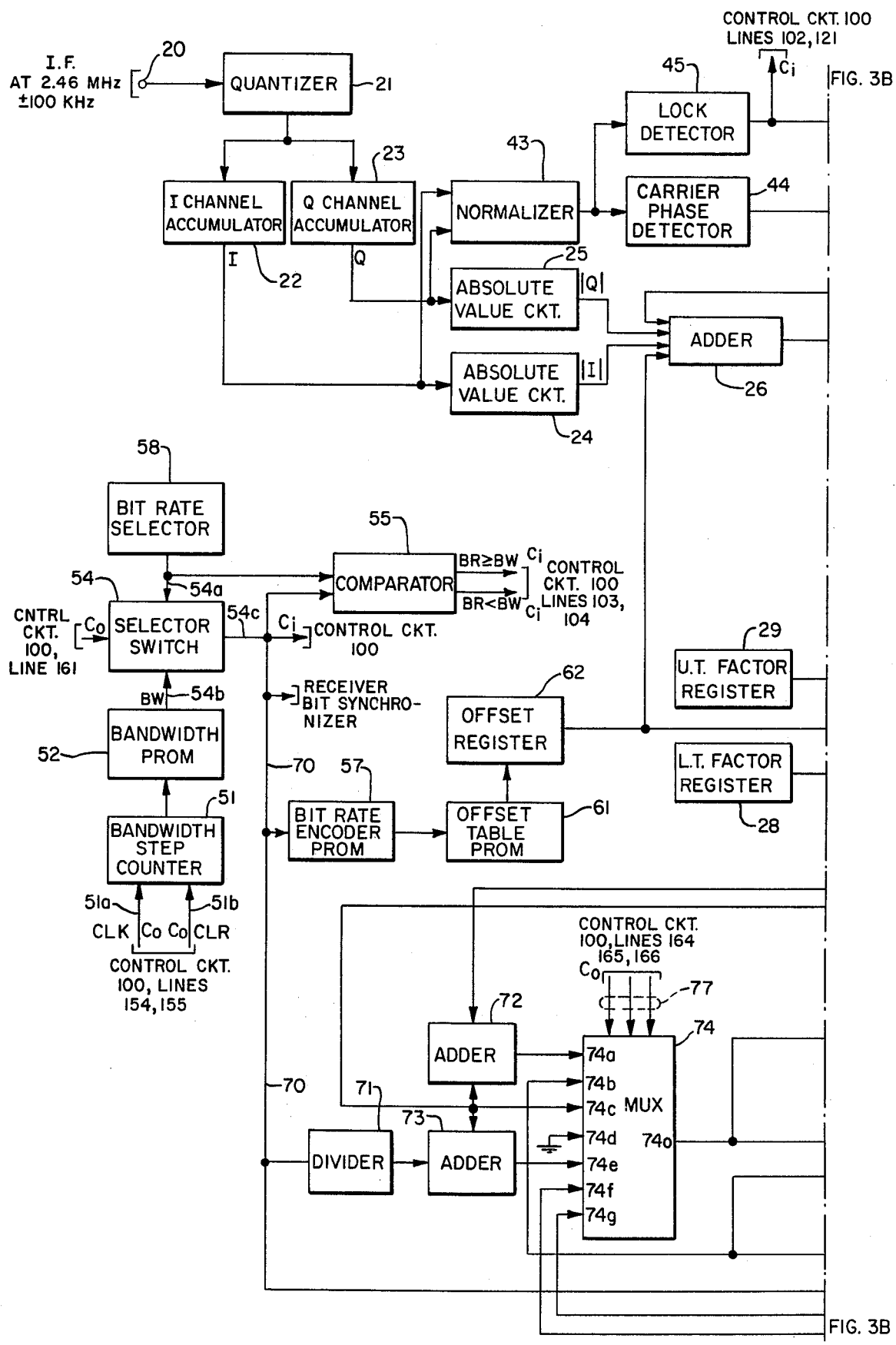

Referring now to FIG. 1 of the drawings, there is shown a graphic plot of a frequency uncertainty range in which there is located a narrow bandwidth signal having a center frequency $f_T$ that is to be acquired and locked onto for data recovery. In the example chosen, the frequency uncertainty range of interest is selected to be $\pm 1$ KHz and centered at a carrier frequency of 70 MHz. Through IF down-conversion circuitry at the front end of the receiver, the uncertainty region is converted to the $\pm 1$ KHz range centered at a suitable IF center frequency such as 2.46 MHz. The problem is to find and lock onto the frequency $f_T$ which, after down-conversion, is located somewhere in the IF range from 2.46 MHz$-1$ KHz to 2.46 mHz$+1$ KHz. It should be understood that the frequency uncertainty range and the center of the range are not limited to the exemplary values given, but may be any frequency value consistent with the teachings herein. In accordance with the invention, the range is selectively variable so as to encompass the range of frequencies to which the loop filter of the receiver may be tuned. Pursuant to the scheme employed in accordance with the invention, the frequency uncertainty range, defined between an upper limit $f_{UL}$ (e.g. 2.46 MHz$+1$ KHz) and a lower limit $f_{LL}$ (e.g. 2.46 MHz$-1$ KHz), is divided into a plurality of frequency subregions or frequency bins. Each frequency bin is of a bandwidth that affords the implementation of a receiver characteristic which, when its center frequency is spaced apart by one-half the bit rate of the digital data signal contained in the transmitted signal from the center frequency of an adjacent bin, overlaps the filter characteristic defined for adjacent bins on each side of the bin of interest and has a magnitude $A_{LF}$ defined as:

$$A_{LF} = \frac{\sin^2\left(\frac{\pi f_c}{BR}\right)}{\left(\frac{\pi f_c}{BR}\right)^2}$$

where $f_c$ is the center frequency of the bin of interest and BR is the bit rate.

In FIG. 1, a group of seven adjacent frequency bins ($Bin_{n-3}$ through $Bin_{n+3}$), the middle bin of which is identified as $Bin_n$, are shown as bounded by broken lines 4 and 5 which lead to an enlarged illustration of three of the seven bins in the upper portion of FIG. 1. The center frequency $f_T$ of the narrowband signal of interest is shown as being located between the center frequencies of $Bin_{n-1}$ and $Bin_n$. (It will be noted that for purposes of simplifying the illustration of the frequency characteristic for the bins shown, i.e. Bins (n−1), (n), (n+1), the side lobes have been omitted.) As was described briefly above, in a first mode of operation of the system (MODE 1), the overlapping frequency subregions or bins into which the range of frequency uncertainty has been divided are examined successively beginning with the bin the center frequency of which may be the lowermost frequency limit (2.46 MHz−1 KHz in the example) and traversing (e.g. increasing) to the bin the center frequency of which may be the uppermost frequency limit (2.46 MHz+1 KHz in the example). Alternatively, the sweep may start at the upper end and proceed to the lowermost bin. In effect, as each bin is examined, the above-described sequential detection process is carried out, wherein the accumulated value of any signal, including noise, contained in the bin is compared with upper and lower thresholds which have been calculated from a stored look-up table to be indicative of the presence or absence of signals. If, at any time during a measurement or test interval, the accumulated signal value exceeds the upper threshold, a "hit" is declared and the test interval is terminated; namely, a decision is immediately made that the bin contains a signal of interest. On the other hand, if, at any time during the test interval, the accumulated signal value drops below the lower threshold, a "dismiss" is immediately declared and the test interval is terminated; namely, a decision is immediately made that the bin contains no signal of interest and that the next adjacent bin should be examined for the presence of a signal. If the accumulated signal value stays between the upper and lower thresholds, without crossing either threshold, for the entirety of the measurement interval, a "hit" is declared; namely, a decision is made that the bin contains a signal of interest. In either case where a decision is made that the bin contains or does not contain a signal of interest, the signal measurements are repeated an appropriate number of times to verify that the decision made is correct. For a located signal, the center frequency of that bin is stored in a frequency memory and a bandwidth search (MODE 2) is initiated.

The bandwidth search is an investigation to determine the widest bandwidth at which phase lock on a detected signal can be achieved. For this purpose, the dump rate is increased to its maximum limit (e.g. 100 KHz) centered about the center frequency of the bin in which there was determined to be a frequency of interest, and the sequential detection process is again carried out, wherein the accumulated signal value is compared with upper and lower thresholds established in accordance with a stored look-up table. If, at any time during the measurement interval, the accumulated signal value at the assumed dump rate exceeds the upper threshold, or if it remains between the upper and lower thresholds for the maximum duration of the measurement interval, then, pursuant to the sequential detection process, a "hit" is declared and the assumed bandwidth is considered to be sufficient to achieve phase lock. On the other hand, if, at any time during the measurement interval, the accumulated signal value at the assumed bandwidth falls below the lower threshold, a "dismiss" is immediately declared, and the assumed bandwidth is considered to be too wide. In either case, just as in the bin search mode (MODE 1) described above, the signal measurements are repeated an appropriate number of times to verify that the determination regarding the assumed bandwidth is correct.

The graphic illustration of the bandwidth search (MODE 2) shown in FIG. 2 depicts that the location of the IF-converted transmitted signal of interest $f_T$ relative to the center frequency $f_c$ of the $Bin_n$ are offset by a frequency difference $\Delta f$. During the bandwidth or dump rate search, each time a series of repeated signal measurements (five, for example) leads to a determination that the assumed bandwidth is too large, the dump rate is decreased by a selected amount causing an effective narrowing of the integrate and dump rate (and thereby the loop filter bandwidth) along lines 11, 12 to a new value less than the previously assumed rate. This series of steps is shown by the "x"s spaced along the center frequency line 13 of $Bin_n$ and referenced in FIG. 2 as "dismisses"; i.e. for each dismiss "x", the assumed bandwidth that was determined to be too large is referred to as a "dismiss", as declared by the sequential detection process. The peak signal power level (located at one of the "x"s along line 13) of the filter response characteristic centered at the $Bin_n$ center frequency $f_c$, at which the assumed bandwidth is determined to be sufficient for phase lock acquisition, is referenced as a "hit", again as declared by the sequential detection process. Once a "hit" has been verified by a series of repeated sequential detection process measurements (thirteen, for example), at a bandwidth corresponding to the "hit" signal power level of the filter response characteristic, a frequency sweep/phase lock process (MODE 3) is initiated in order to phase lock onto the signal of interest $f_T$.

Through this frequency sweep/phase lock process, the frequency of a carrier reference (the receiver IF local oscillator) employed in the phase lock circuitry is swept from a lower value to an upper value, the difference between which corresponds to the widest loop filter bandwidth, centered about the bin center frequency $f_c$, that was determined during the previous bandwidth search operation to be sufficiently narrow to phase lock onto transmitted frequency $f_T$. The lower frequency value is initially set at a frequency corresponding to the center frequency $f_c$ of the $Bin_n$ minus one-half the bandwidth finally decided upon in the previous bandwidth search operation. This frequency is identified in FIG. 2 as frequency $f_S-$. The upper frequency value is initially set at a frequency corresponding to the center frequency $f_c$ of $Bin_n$ plus one-half the bandwidth finally decided upon in the previous bandwidth search operation. This frequency is identified in FIG. 2 as frequency $f_S+$. In some cases, the bin where a frequency of interest was located is at or close to one end of the frequency uncertainty range, so that the result of the bandwidth search may place a sweep limit beyond the frequency uncertainty range. In this case, the closest boundary of the frequency uncertainty range is used as the appropriate sweep limit since, by definition, the transmitted frequency $f_T$ cannot lie outside the frequency uncertainty range. If the phase lock circuitry fails to acquire phase lock during the sweep of the receiver local oscillator, the bandwidth is again reduced by an amount corresponding to a prescribed decrease in the peak signal power level at the bin center frequency $f_c$ (e.g. 2.1 dB) and the carrier sweep process is repeated beginning at a new lower value and terminating at a new upper value determined by the bandwidth reduction carried out at the end of the first sweep. This process is repeated until phase lock is achieved. (It is to be noted that phase lock onto frequency $f_T$ usually occurs during the initial sweep of the receiver local oscillator.)

Once phase lock has been achieved, it is necessary to convert the loop filter bandwidth to the fractional bit rate or data rate. For this purpose, the dump rate corresponding to the loop filter bandwidth ($f_{BW-} \rightarrow f_{BW+}$) at which phase lock was achieved during the sweep of the carrier reference frequency in the previous operation is compared with the bit rate (MODE 4). If the dump rate is greater than the bit rate, it is reduced by a prescribed amount (e.g. again corresponding to 2.1dB steps) at a rate determined by the phase lock detection circuitry. This phase lock acquisition-dependent reduction of the dump rate permits the phase lock loop to remain centered on the transmitted frequency $f_T$. In this process, the dump rate is initially set at the dump rate at which phase lock was achieved, but is centered at the frequency at which phase lock occurred, i.e. the locked-onto signal $f_T$. The dump rate (corresponding to a loop filter bandwidth now centered about the signal frequency $f_T$) is reduced in steps, corresponding to a prescribed power level change (e.g. 2.1 dB) in the signal acquistion loop filter characteristic, until the dump rate is reduced to the bit rate. These 2.1 dB reduction steps are indicated in FIG. 2 as "x"s along signal center frequency line 14. Once the bit rate is reached, the dump rate is fixed at this bit rate (MODE 5) and, with the phase lock loop circuitry still tracking the signal center frequency $f_T$, the signal acquistion circuitry is considered to have achieved final lock so that data demodulation can commense.

The foregoing description is a concise presentation of the signal processing procedure (MODES 1 through 5) through which a transmitted narrowband signal of unknown center frequency $f_T$ is located and locked onto, so that data contained therein can be demodulated. The description to follow will set forth a preferred embodiment of the combination of signal processing components, through the operation of which the above-outlined signal processing MODES 1 through 5 may be implemented.

In FIGS. 3A and 3B, there is shown a general block diagram of signal processing and evaluation circuitry according to the present invention. The individual circuitry components of which the present invention is comprised are conventional, so that a detailed explanation thereof will, for the most part, be omitted in order to keep the description of the invention concise; however, where a description of the details of the function and/or the operation of the components shown in FIGS. 3A and 3B will facilitate a better understanding of the invention, further explanation will be provided.

In this regard, an additional FIG. 4, which shows the combinational logic through which the operation of the system shown in FIGS. 3A and 3B is controlled, will be described in detail below.

Referring now to FIGS. 3A and 3B, there is shown an input terminal 20 to which monitored frequencies to be evaluated for signal content are supplied. Terminal 20 is coupled to the output of IF down conversion circuitry of the receiver (not shown), the carrier reference (e.g. a digitally controlled IF local oscillator) frequency for which is to be stepped, during the bin search (MODE 1), in sequence from the center frequency of the lowermost frequency bin of the frequency uncertainty region toward the center frequency of the uppermost bin of the frequency uncertainty region (e.g. from 2.46 MHZ$-1$ KHz toward 2.46 MHz$+1$ KHz as described previously). The in-phase (I) and quadrature-phase (Q) outputs of the receiver are supplied from terminal 20 to a quantizer 21 wherein the signal power of the respective I and Q channels is digitized into the proper format for signal evaluation. The digital outputs of quantizer 21 are coupled to in-phase (I channel) and quadrature-phase (Q channel) accumulators 22 and 23, respectively. I and Q channel accumulators 22 and 23 may comprise suitable buffer registers, having a plurality of parallel inputs coupled to the respective bit outputs of quantizer 21, for storing the digital representations of the signal values of the I and Q channel contents corresponding to the bin center frequency to which the IF local oscillator carrier loop filter of the receiver is presently tuned.

As was explained previously, the loop filter bandwidth is established as a small fraction of the bit rate clock that is used to control the operations of I and Q accumulators 22 and 23. Namely, the bandwidth of I and Q accumulators 22 and 23 is controlled by the bit rate clock and is equal to their integrate and dump rate, so that by varying the integrate and dump rate, there occurs a proportional change in the loop filter bandwidth. The contents of I and Q channel accumulators 22 and 23 are coupled to normalizer 43. The output of normalizer 43 is coupled to a suitable carrier phase detector 44 and to a lock detector 45. Normalizer 43 and carrier phase detector 44 operate in a conventional manner to detect the phase of the frequency being monitored by the receiver relative to the reference frequency to which the receiver is tuned, in accordance with the I and Q components of the received frequency.

The contents of accumulators 22 and 23 are further coupled to respective absolute value circuits 24 and 25 which produce outputs corresponding to the absolute value of each of the in-phase and quadrature frequency components. These outputs are coupled to an adder 26 which sums the contents of the absolute value circuits 24 and 25 with a pair of additional values. The first of these values is an offset value, supplied from an offset table-storing programmable-read-only-memory (PROM) 61 and derived in accordance with either a prescribed bit rate or bandwidth, as will be described in greater detail below. The offset values stored in PROM 61 are determined in accordance with the frequency response characteristic of the loop filter of the receiver and represent changes in the characteristic as the bandwidth is changed. As an example, each successive value may represent a change in the integrate and dump rate corresponding to a 2.1 dB change in the peak signal power of the loop filter response characteristic. These codes are used during various modes of operation of the system to define the receiver bandwidth, as will be explained in detail below. The address input table PROM 61 is coupled to the output of a bit rate encoder 57 that converts a digital input code representative of bit rate or bandwidth into an appropriate address code for addressing the proper memory location in PROM 61 which contains the offset value to be used. The input to encoder 57 is coupled to the output 54c of selector switch 54. Selector switch 54 has a first input 54a coupled to the output of a bit rate selector 58 to receive a data bit rate code that corresponds to the data rate of the information contained in the transmitted narrowband signal (centered at $f_T$), such as may be produced by a set of conventional thumbwheel switches (not shown), that are configured to produce a set of BCD output signals in accordance with the decimal bit rate indicated on the switch wheels. Bit rate selector 58 thus defines the bit rate of the data contained in a narrowband frequency to be acquired and is used to establish the final dump rate and the final bandwidth of the receiver loop filter at final lock after phase lock has been achieved. Selector switch 54 has a second input 54b coupled to the output of a bandwidth PROM 52. Bandwidth PROM 52 is programmed to produce a respective digital code representative of a prescribed dump rate bandwidth in accordance with the output of a bandwidth step counter 51 to which PROM 52 is coupled. The codes stored in PROM 52 may vary from a maximum bandwidth of 100 KHz to successively lower orders corresponding to 2.1 dB steps in the loop filter response characteristic; the code supplied at the output of PROM 52 will depend upon the address code supplied by step counter 51. Step counter 51 is clocked to step through a series of digital codes by which PROM 52 is addressed so as to supply bandwidth-representative codes used by bit rate encoder 57 for controlling the generation of the necessary offset value stored in PROM 61 during the bandwidth search (MODE 2) and so as to supply codes to be used in the frequency sweep (MODE 3) and bandwidth reduction (MODE 4), described briefly above and explained in more detail below. The output 54c of selector switch 54 and the code produced by the bit rate selector 58 are coupled to a comparator 55. Comparator 55 is employed during bandwidth reduction (MODE 4) to compare whether the dump rate is equal to or less than the bit rate and, therefore, whether bandwidth reduction should continue or cease. The output of comparator 55 is coupled, via output terminal 56, to one input of a control circuit 100 (shown in FIG. 4).

Control circuit 100 is comprised of combinational logic elements that respond to various signals produced within the system (such as the output of comparator 55) and control the switching of the connection between components as necessary to step through the successive MODES 1 through 5 of the signal acquisition process described above. The constituents and operation of control circuit 100 will be explained subsequently with reference to FIGS. 4 and 4A. For the purpose of simplifying the system diagram shown in FIGS. 3A and 3B, the terminals labelled as "Ci" represent terminals that produce signals to which control circuit 100 responds in controlling system operation; those terminals labelled as "Co" represent terminals to which output signals produced by control circuit 100 are supplied for controlling system operation.

The offset value generated by PROM 61, in response to an address code supplied from bit rate encoder 57 and stored in register 62, is also suplied to a pair of multipliers 30 and 31 wherein the offset value is suitably scaled to lower and upper threshold values LT and UT, respectively. These lower and upper threshold values are, in turn, respectively supplied to lower and upper threshold detectors 32 and 33, as first inputs thereto. A second input for each of threshold detectors 32 and 33 is obtained from a summation accumulator 27 which accumulates the output of adder 26. The contents of accumulator 27 also provide one of the inputs for adder 26. Lower threshold detector 32 compares the contents of accumulator 27 with the lower threshold value LT supplied by multiplier 30 and generates an output (identified as a "dismiss") upon the contents of accumulator 27 dropping below the lower threshold value. Upper threshold detector 33 compares the contents of accumulator 27 with the upper threshold value supplied by multiplier 31 and generates an output (identified as a "hit") upon the contents of accumulator 27 exceeding the upper threshold value. These "dismiss" and "hit" signals are coupled to control circuit 100 (the "hit" signal via OR gate 38) and to OR gate 36. The output of OR gate 36 is coupled to the reset or clear input of accumulator 27, via OR gate 37, and also the reset or clear input of a time-out counter 41. Time-out counter 41, is, in effect, a timer that counts clock pulses produced by a bit rate clock up to a prescribed number (e.g. sixty-four) and produces an output upon the number of clock pulses reaching this number. The output of counter 41 is coupled to OR gate 38 and, via OR gate 37, to the reset or clear input of accumulator 27.

The components described thus far form signal detection circuitry and are used in the sequential detection process to determine whether, for a frequency bin and/or dump rate characteristic being examined, signal presence is detected so as to advance to the next mode of operation of the system. The functional cooperation among these and the remaining components of the combination illustrated in FIGS. 3A and 3B will be described in detail below in conjunction with the description of the system operation.

The frequency monitoring and storage portion of the system shown in FIGS. 3A and 3B comprises frequency comparator and buffering components through which the monitored frequencies and assumed bandwidths are modified for achieving phase lock. More specifically, the output of selector switch 54, which represents either an established bit rate or selected bandwidth, depending upon the mode of system operation, is coupled over line 70 to a divide-by-two divider 71, respective sum and difference circuits 81 and 82, and the bit rate synthesizer of the loop filter. A line 69 which is coupled to the output 48c of multiplexer 48 is coupled to one input of adder 72, so as to couple either the output of phase detector 44 or the contents of a sweep register 47 to a first input of adder 72. Sweep register 47 stores a code for controlling the carrier frequency to which the receiver is tuned during frequency sweep (MODE 3) and is coupled to lock detector 45. Lock detector 45 is coupled to normalizer 43 and, as part of the phase lock loop or bit synchronization circuitry of the receiver, generates an output upon phase lock being achieved. This phase lock indication signal is supplied to control circuit 100. Multiplexer 48 is controlled by control circuit 100. During the frequency sweep mode when phase lock is acquired, output 48c of multiplexer 48 is coupled to input 48a, so as to couple the contents of sweep register 47 to adder 72. Once phase lock has been acquired, output 48c is coupled to input 48b so that the output of phase detector 44 will be supplied to adder 72.

The output of divider 71 is coupled to a first input of adder 73. A second input of each of adders 72 and 73 is coupled to receive the contents of a lag accumulator 75. Lag accumulator 75 forms part of the carrier loop filter of the receiver and may comprise a suitable register for storing a digial code representative of the frequency to which the digitally controlled local oscillator of the receiver responds to tune the receiver to a particular frequency. The input of lag accumulator 75 is coupled to the output 74o of a multiplexer 74. Multiplexer 74 has a plurality of input terminals 74a through 74g, an output terminal 74o, and a control line 77. Control line 77 may be comprised of a set of a suitable number of binary data leads coupled to control circuit 100 and defining a code for controlling which of the inputs of multiplexer 74 is connected to its outputs 74o. Thus, for the various inputs shown, control line 77 may contain three binary data leads, sufficient for designating eight codes and, therefore, up to eight inputs for multiplexer 74. Input terminal 74a of multiplexer 74 is coupled to the output of adder 72, while terminal 74b is coupled to receive the contents of a frequency memory 76. Frequency memory 76 may comprise a suitable buffer register which is used to store a digital code representative of the center frequency of one of the frequency bins in the range of frequency uncertainty. This frequency-representative code is supplied either from output terminal 74o of multiplexer 74 or is recirculated from memory 76 itself, via a gate 79, under the control of a signal from control circuit 100.

Terminal 74c of multiplexer 74 is coupled to receive the contents of lag accumulator 75, while terminal 75d, which is used to clear the contents of lag accumulator 75, is grounded. Terminal 74e is coupled to the output of adder 73, while terminals 74f and 74g are coupled to the outputs of gate circuits 85 and 86 which, in turn, form part of a comparator switch 88. Comparator switch 88 has a pair of reference input lines, coupled to a sweep limit selector 87, which supply to comparator switch 88 codes representative of the upper and lower frequencies ($f_{UL}$ and $f_{LL}$) that establish the boundaries of the range of frequency uncertainty to be searched. Sweep limit selector 87 may comprise a suitable buffer register which stores a pair of digital codes set therein by a set of switches provided for the purpose. These upper and lower frequency limits are compared with the outputs of adder 81 and subtractor 82, in the bandwidth search, sweep modes of operation of the system, by comparators 83 and 84, to determine whether or not the frequency sweep would cause an investigation into a frequency region outside the region defined between the limits supplied by selector 87. The outputs of comparators 83 and 84 are coupled to flip-flops 93 and 94, respectively, to selectively enable gate circuits 85 and 86. Flip-flops 93 and 94 are normally reset by a system clock signal at the end of a processing cycle, but may be directly reset and set, respectively, by an output from control circuit 100. This latter latch signal is used to directly establish the proper frequency limits for the various modes of operation of the system, based upon the bandwidth and the selected frequency uncertainty limits. During the bin search, bandwidth reduction, and final lock modes, (MODES 1, 4, and 5, respectively) flip-flops 93 and 94 may be directly placed in the reset and set states, respectively, by a control signal from control circuit 100, thereby causing gate circuits 85 and 86 to couple the upper and lower sweep limits ($f_{UL}$ and $f_{LL}$) supplied by sweep limit selector 87, to comparator 91 and 92, respectively. During the bandwidth search and sweep modes (MODES 2 and 3), the state of flip-flops 93 and 94 may not be directly controlled by control circuit 100, but by the outputs of comparators 83 and 84, so that either the limits supplied by selector 87 or the limits supplied by adder 81 and subtractor 82 will be coupled, via gate circuits 85 and 86, to comparators 91 and 92, depending upon whether or not the outputs of circuits 81 and 82 fall outside the region of frequency uncertainty.

As was explained above, comparators 83 and 84 compare the upper and lower thresholds from selector 87 with the outputs of adder 81 and subtractor 82, respectively. Each of adder 81 and subtractor 82 has a first input coupled to receive the contents of frequency memory 76 and a second input coupled via line 70 to output 54c of selector switch 54. Therefore, the output of adder 81 ($f_c + BW$) is representative of the sum of the contents of frequency memory 76 ($f_c$) and the value (BW) supplied through selector switch 54, while the output of subtractor 82 ($f_c - BW$) is representative of the difference between the contents of frequency memory 76 ($f_c$) and the value (BW) supplied through selector switch 54.

In addition to being coupled to input terminals 74f and 74g, respectively, of multiplexer 74, the outputs of gate circuits 85 and 86, respectively, are coupled to first inputs of comparators 91 and 92. Each of comparators 91 and 92 has an output coupled to control circuit 100. Comparators 91 and 92 compare the contents of the lag accumulator 75 with either the limits supplied by sweep limit selector 87 or the output of adder 81 and subtractor 82, respectively. Comparator 91 is used to determine if the upper frequency limit of the rage of frequency uncertainty has been reached, during MODE 1, where the frequency bins have been stepped in a direction of increasing frequency, and during the frequency sweep MODE 3. For transmitted frequencies the signal power of which is expected to be strong, the bin step mode may proceed in a direction of decreasing frequency, in which case comparator 92 is used to determine if the lower frequency limit of the range of frequency uncertainty has been reached. The output of one of comparators 91 and 92 is coupled to control circuit 100 (depending upon the direction of frequency search) to cause the contents of lag accumulator 75 to be reset to the proper bin center frequency depending upon the mode of operation. For MODE 1, this center frequency is the center frequency of the frequency bin at the opposite end of the uncertainty range. In MODE 2, where the loop filter may drift, the lag accumulator code is reset to the center frequency of the bin identified in MODE 1, if the loop detection circuitry attempts to track a signal outside the range of frequency uncertainty. For MODE 3, upon the upper end of the sweep limit being reached, comparator 91 supplies an output to control circuit 100, causing a reduction in bandwidth and a restart of the frequency sweep at a new lower limit. A more detailed explanation of the operation of the comparators 83, 84, 91, and 92 will be provided in the description of operation of the system below.

Referring now to FIG. 4, the combinational logic of which control circuit 100 is configured will be described. The basic constituents of control circuits 100 are a set of control latches or flip-flops FF1 through FF5, the states of which depend upon input signals obtained from various components that make up the system shown in FIGS. 3A and 3B and the appropriate Q and Q outputs of which are logically decoded to generate control signals to be supplied to various portions of the system. FIG. 4A shows the relationship between the state of the Q output of each flip-flop FF1 through FF5 and the various modes through which the system advances in carrying out the sequential detection process in accordance with the present invention. Reference may be had to FIG. 4A during the description of the operation of the system set forth below.

Referring again to FIG. 4, control circuit 100 has an input line 101 coupled to receive a processing cycle start signal from the system clock which controls the rate at which the system advances through the successive modes of operation. Clock line 101 is coupled to one input of NAND gate 134 and to reset inputs of HIT flip-flop 145 and DISMISS flip-flop 151, respectively. Input line 102 is coupled to the output of lock detector 45 and is used to control the state of flip-flops FF3, FF4, and FF5 depending upon the mode of operation of the system. For this purpose, line 102 is coupled via inverter 109 to one input of AND gate 110, the output of which is coupled to the set input of flip-flop FF3. Line 102 is also coupled to one input of AND gate 181, the output of which is coupled to the set input of flip-flop FF4, and to one input of NAND gate 182, the output of which is coupled, via inverter driver 183, to the set input of flip-flop FF5. Line 102 is also coupled directly to the reset latch input of flip-flop FF5. Line 102 goes high when the phase lock circuitry acquires phase lock and is low otherwise.

Lines 103 and 104 are coupled to the outputs of comparator 55. Lead 103, which is high when the bandwidth is less than or equal to the bit rate, is coupled to one input of AND gate 110 and one input of NAND gate 182. The output of AND gate 100 is coupled to the set input of flip-flop FF3. Lead 104, which is high when the bandwidth is greater than the bit rate, is coupled to the other input of AND gate 181. Lead 105 is coupled to receive a processing cycle end signal from the system clock circuitry and supplies this signal through inverter 106 to one input of NAND gate 108. The other input of NAND gate 108 is coupled to the Q output of HIT flip-flop 145, which Q output is also coupled as one of the binary code inputs bits of multiplexer control decoder 153. Decoder 153 responds to the state of various logic lilnes in control circuit 100 and couples switching control signals over leads 164, 165, and 166 to the three leads of which the control line 77 for multiplexer 74 is formed. The output of NAND gate 108 is coupled to the reset input of flip-flop FF2.

Input line 115 is coupled via OR gate 38 (FIG. 3) to the output of upper threshold detector 33 and time-out counter 41 and responds to "hit" indications to trigger flip-flop FF1 via inverter drivers 111 and 112. Line 115 is also coupled to the clear or reset input of a DISMISS counter 127, so that the contents of DISMISS counter 127 are cleared upon the indication of a "hit". The output of inverter 111 is further coupled to one input of NAND gate 116, while the output of inverter driver 112 is coupled to the clock or count input of HIT counter 113, the latter connection causing the contents of HIT counter 113 to be incremented upon a "hit" indication.

Input line 121 is coupled to lock detector 45 and goes high when the lock detector has acquired phase lock. This lead is used to control the rate at which bandwidth is reduced during MODE 4 and is coupled to one input of AND gate 119. The other input of AND gate 119 is coupled to the Q output of flip-flop FF4. AND gate 119 serves to control the advance or stepping of step counter 51 during the bandwidth reduction mode (MODE 4) and has its output coupled via NOR gate 137 to one input of NAND gate 133. The output of NAND gate 133 is coupled to one input of NAND gate 132 and to output lead 154 which is coupled to clock input line 51a of step counter 51. The other input of NAND gate 133 is coupled to the output of NAND gate 134. NAND gate 134 has a second input coupled to the output of AND gate 135. A first input of AND gate 135 is coupled to the Q output of flip-flop FF1. The Q output of flip-flop FF1 is also coupled to the reset latch inputs of flip-flops FF2 and FF3, one input of AND gate 117, one input of NAND gates 116 and 138, one input of NAND gate 132, and output leads 155 and 156. Output lead 155 is coupled to the clear input line 51b of step counter 51. Output lead 156 is coupled to the control line of gate 79 for controlling which of inputs 79a and 79b is connected to output 79c, and thereby controlling whether the contents of frequency memory 76 are recirculated or replaced by the contents of the lag accumulator 75. The output of NAND gate 132 is coupled to the reset or clear input of HIT counter 113.

The second input of NAND gate 138 is coupled to the Q output of flip-flop FF5. NAND gate 138 serves to control the operation of selector switch 54 and, for this purpose, has its output lead 161 coupled to the control input of selector switch 54. As can be seen from FIG. 4A, during MODES 1 and 5, the state of flip-flops FF1 and FF5 are such that only one of the inputs to NAND gate 138 is high or true, so that line 161 will be high, causing selector switch 54 to couple the output of bit rate selector 58 to line 70. During MODES 2, 3, and 4, both inputs to NAND gate 138 are high, thereby causing line 161 to be low and, in response, selector switch 54 couples the output of bandwidth PROM 52 to line 70.

Lead 122 couples the output of lower threshold detector 32 to the clock oir increment of DISMISS counter 127 via inverter driver 126. DISMISS counter 127 is configured to count a prescribed number (e.g. five) of consecutive "dismiss" indications supplied to line 122 before generating an output. The output of DISMISS counter 127 is coupled to the reset input of flip-flop FF3 and to the set latch input of DISMISS flip-flop 151. The output of DISMISS counter 127 is also coupled, via inverter driver 118, to one input of AND gate 136. The output of AND gate 136 is coupled to a second input of NOR gate 137. A second input of AND gate 136 is coupled to the output of AND gate 117, which is also coupled to a third input of AND gate 110, inverter 142, and one of the multiple bit inputs of decoder 164. The second input of AND gate 117 is coupled to the Q output flip-flop FF2. The Q output of flip-flop FF2 is also coupled to one input of NAND gate 131. The Q output of flip-flop FF2 is coupled to a third input of AND gate 135 and one input of AND gate 152. Another input of AND gate 152 is coupled to the Q output of flip-flop FF5.

The second input of NAND gate 131 is coupled via inverter driver 130 to the output of NAND gate 116, the third input of which is coupled to the output of HIT counter 113. The output of NAND gate 131 is coupled to the set latch input of HIT flip-flop 145.

Input lead 128 couples the output of OR gate 36 to the reset input of flip-flop FF4. The reset latch input of flip-flop FF4 and the reset latch input of flip-flop FF1 are coupled to the $\overline{Q}$ output of flip-flop FF3. The set latch input of flip-flop FF3 is coupled to a reset switch 180 and to reset line 162 for supplying a resetting ground potential to various portions of the system when it is cleared for a new sequential detection process.

Input lead 123 is coupled to the output of one of comparators 91 and 92, depending upon the direction of the frequency sweeping or stepping process. If the frequency stepping process proceeds from a lower frequency in the direction of increasing frequency, comparator 91 is coupled to line 123. If the frequency stepping process proceeds from an upper frequency in the direction of decreasing frequency, comparator 92 is coupled to lead 123. Lead 123 enables the third input of AND gate 135 upon the contents of lag accumulator 75 reaching a frequency limit during the bandwidth search or frequency sweep modes. In the frequency sweep mode (MODE 3), if phase lock is not acquired upon the upper frequency limit being reached, the bandwidth is reduced and the sweep is restarted at a new end frequency (e.g. a new lower frequency for a sweep in the direction of increasing frequency). Reduction of bandwidth is carried out by a step or increment signal on line 154 to the clock input of the step counter 51. The comparator limit output signal on line 123 is delayed by a suitable delay circuit 186 and coupled to multiplexer control decoder 153. The purpose of delay circuit 186 is to provide time for a new value to be supplied over line 70 before multiplexer 74 is switched, so that the lag accumulator 75 can be correctly loaded with the new sweep limit.

Input lines 124 and 125 are coupled from prescribed bit outputs from selector switch 54 to a decoder 150. Decoder 150 provides a pair of inputs to AND gate 144 representative of range limits within which the codes coupled through switch 54 are defined. One line may for example, represent that the bandwidth or bit rate is within the range of 1–10 KHz, while the other lead may represent the next decade, i.e. 10–100 KHz. These lines are coupled to first and second inputs of AND gate 144, and are combined with a third inut of AND gate 144 to control the direct resetting and setting of flip-flops 93 and 94 in accordance with the mode of operation and the codes supplied by selector switch 54. The third input of AND gate 144 is coupled to the output of comparator 143 which effectively determines the mode of operation of the system by evaluating the states of combinations of the control flip-flops and controls the operation of gate circuits 85 and 86 of the comparator switch 88 during the various modes, so as to define the frequency limits to be used in carrying out these modes.

The logical connections to AND gate 144 are defined so that, assuming the bit rate or bandwidth code values decoded by decoder 150 are within the proper ranges, for MODES 1, 4, and 5, the output of AND gate 144 goes low, causing line 162 to directly reset flip-flop 93 and directly set flip-flop 94, whereby the upper and lower sweep limits from sweep selector 87 are used for comparison purposes by comparators 91 and 92. During MODES 2 and 3 the output of AND gate 144 is high, so that the line 162 has no effect on the state of flip-flops 93 and 94. Instead, the limits that are supplied at the outputs of gate circuits 85 and 86 are determined in accordance with the operation of comparators 83 and 84. As long as the lower frequency limit defined by the difference between the output (BW) of PROM 52 and the stored bin center frequency ($f_c$) is not lower than the lower limit of the frequency uncertainty range, comparator 84 will cause gate circuit 86 to couple the difference lower frequency limit ($f_c - BW$) to comparator 92; otherwise, flip-flop 92 is reset, so that the lower limit $f_{LL}$ is supplied via gate circuit 86 from sweep limit selector 87. Similarly, as long as the upper frequency limit defined by the sum of the output of PROM 52 and the stored bin center frequency $f_c$ is not greater than the upper limit ($f_c + BW$) to comparator 91; otherwise, flip-flop 93 is reset so that the upper limit is supplied via gate circuit 85 from sweep limit selector 87. Thus, the state of line 162 permits comparators 83 and 84 to choose the appropriate limits during MODES 2 and 3. The logical equation for the state of line 162 is:

Line 162 (Limit Select) = [(FF4 + FF1·$\overline{FF2}$) ⊕ (FF2·$\overline{FF5}$)]·(Line 123)·(Line 124).

For determining in which mode AND gate 144 will be enabled, a comparator 143 has a first input coupled to the output of NAND gate 141, a first input of which is coupled to the $\overline{Q}$ output of flip-flop FF4 and a second input of which is coupled to the output of inverter 142. The second input of comparator 143 is coupled to the output of AND gate 152, which is also coupled to one of the multibit inputs of multiplexer control decoder 153. Additional inputs to control decoder 153 are derived from the Q outputs of MISS flip-flop 151 and flip-flop FF5, respectively.

With the interconnection of the various components which make up the sequential detection system according to the present invention having been set forth, the operation of the system and the manner in which the various system components shown in FIGS. 3A, 3B, and 4 operation will now be explained.

OPERATION

Figure 5:
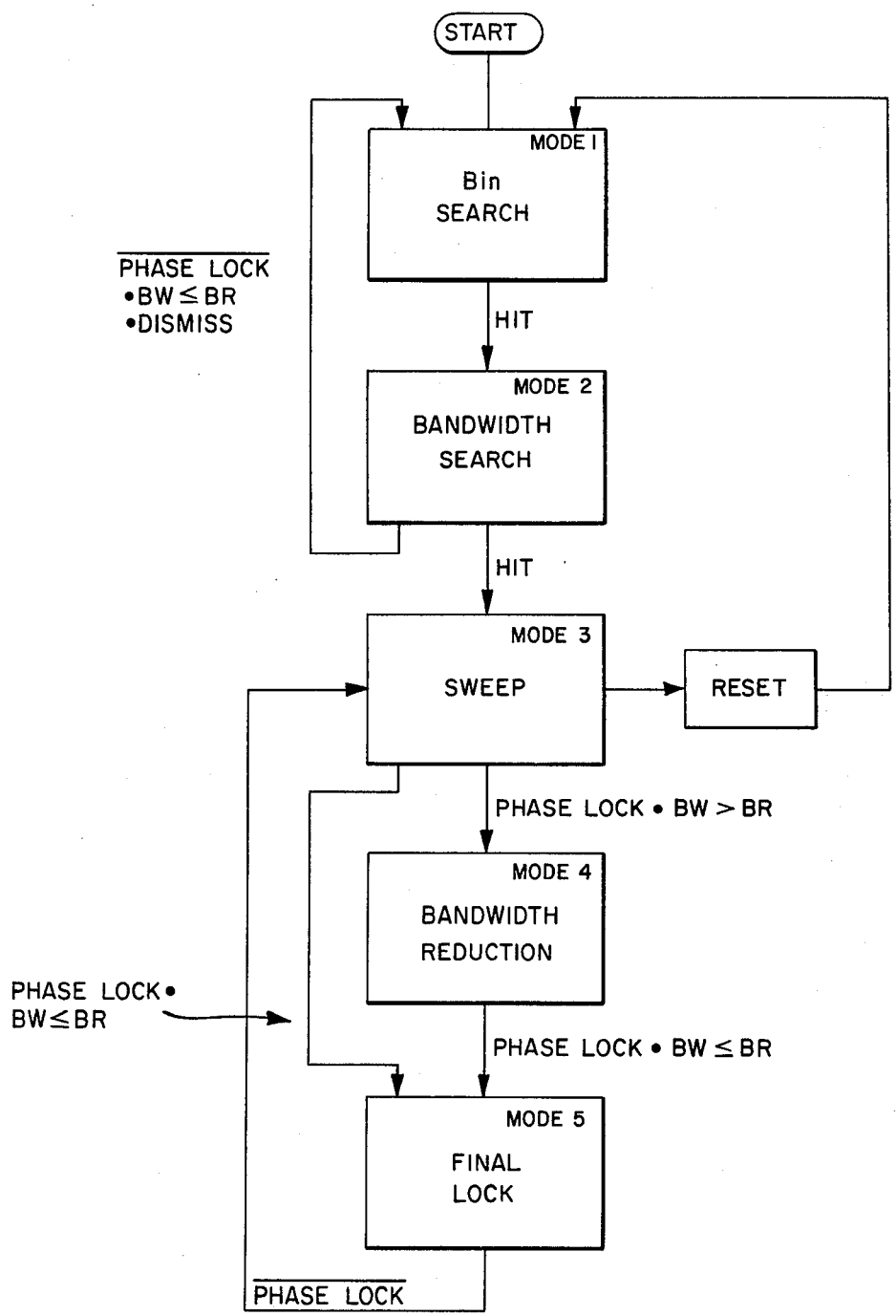
FIG. 5 is a general flow chart showing the sequence of the modes of operation of the signal detection and acquistion system in accordance with the present invention.

FIG. 5 depicts a general flow chart of a sequence of five modes that are carried out by the signal processing and evaluation circuitry described previously with reference to FIGS. 3A, 3B, 4, and 4A. The presentation to follow will describe the operation of the components of the system as each mode is carried out from initial search (MODE 1) through final lock (MODE 5).

BIN SEARCH (MODE 1)

As was described briefly above, a region of frequency uncertainty that may contain a narrowband signal of interest is searched in frequency subregions or frequency bins, as graphically illustrated in FIG. 1, beginning with the bin the center frequency of which corresponds to the frequency limit at one end of the uncertainty range and terminating in the bin the center frequency of which corresponds to the frequency limit of the other end of the uncertainty range. In the present example, the direction of search has been chosen to be in the direction of increasing frequency, so that the region of frequency uncertainty is searched from the lowermost frequency bin to the uppermost frequency bin. Thus, the search begins at the lower frequency limit of the range ($f_{LL}$) and terminates at the upper frequency limit of the range ($f_{UL}$). These upper and lower limits may be selectively set by way of external panel switches, such as limit-defining thumbwheel switches (not shown), coupled to supply upper and lower frequency limit values to be stored by sweep limit register 87, and supplied therefrom to comparators 83 and 84 and to gate circuits 85 and 86, respectively.

The beginning of a bin search corresponds to a system reset condition. When reset switch 180 is closed, flip-flop FF3 is set and a reset output signal is applied to various components of the system via line 163. With flip-flop FF3 being set, its $\overline{Q}$ output goes low, resetting flip-flops FF1 and FF4. Since flip-flop FF1 is reset, its Q output goes low and causes flip-flops FF2 and FF3 to be reset. In respond to the reset signal from line 163, a system clock signal supplied over line 167 resets flip-flop FF5, so that each of flip-flops FF1 through FF5 is cleared to reset as shown in FIG. 4A. The states of logic inputs of multiplexer decoder 153 are such that the code supplied on leads 164-166 (i.e. control link 77 of multiplexer 74) couples output 74o to input 74g, whereby the center frequency of the lowermost frequency bin (i.e. the lower limit $f_{LL}$ supplied by sweep limit selector 77) is coupled via gate circuit 86 to input 74g of multiplexer 74. The digitally controlled IF local oscillator of the receiver loop filter circuitry responds to the lower frequency of the bin search at the center frequency of the lowermost bin, as illustrated graphically in FIG. 1. The dump rate, to which the bandwidth of the loop filter corresponds, as established by the bit rate synthesizer is set at a value supplied from bit rate selector 58, which is coupled over line 70 to the bit rate synthesizer via selector switch 54.

The receiver, being tuned to the center frequency $f_{LL}$ of the lowermost frequency bin, now monitors in the lowermost frequency bin, the width of the bin corresponding to the filter characteristic having a magnitude defined by equation (1) above the sequential detection process, described previously, is carried out in order to rapidly locate a frequency bin in which a narrowband signal of interest is located. For this purpose, the received output that is coupled via terminal 20 to quantizer 21 is quantized into digital format and supplied to in-phase (I) and quadrature-phase (Q) accumulators 22 and 23, wherein digital signals representative of the received sine and cosine components of the received signal are stored. The absolute values of the respective I and Q channel components are supplied to adder 26 wherein they are summed with the contents of summation accumulator 27 and an offset value derived from offset table PROM 61. Since summation accumulator 27 is one of the components whose contents are cleared at the commensement of system operation, there is initially the value of zero that is coupled therefrom to adder 26. With each of the FF1 through FF5 being reset, the input of NAND gate 138 that is coupled to the Q output of flip-flop FF1 will be low, so that the output of NAND gate 138 is high. This output is coupled via line 161 to the control terminal of selector switch 54. The other input of gate 138 is coupled to $\overline{Q}$ output of flip-flop FF5, so that in either MODE 1 or MODE 5 the state of line 161 will be high, causing selector switch 54 to couple the output of bit rate selector 58 to output terminal 54c, whereas for MODES 2, 3, and 4, the state of line 161 will be low, causing selector switch 54 to couple the output of PROM 52 to output terminal 54c. Thus, during the present bin search (MODE 1), the bit rate supplied by bit rate selector 58 is encoded by bit rate encoder 57 to address PROM 61 which supplies an offset value that is stored in offset register 62. This offset value is summed with the value of summation accumulator 27 (zero initially) and the $|I|$ and $|Q|$ outputs of absolute value circuits 24 and 25, and the sum is supplied to summation accumulator 27. The contents of summation accumulator 27 are monitored by upper and lower threshold detectors 32 and 33 for a period of time governed by time-out counter 41 which begins counting bit rate clock pulses at the beginning of a signal power investigation interval. Unless it is reset by an output from OR gate 36, time-out counter 41 counts bit rate clock pulses up to a prescribed number, resets or clears the summation accumulator at the end of the interval, and informs control circuit 100 of the end of the count interval. As the $|I|$, $|Q|$, and offset values are integrated by adder 26 and summation accumulator 27, the contents of accumulator 27 are compared with upper and lower threshold values produced by multiplying the contents of offset register 62 by a pair of factor reference values stored in registers 28 and 29 and supplied to multipliers 30 and 31 from which the upper (UT) and lower (LT) threshold values are derived. Using the signal characteristic graphic plot shown in FIG. 1 as an example, it will be assumed that the integrated contents of accumulator 27 fall below the value supplied by multiplier 30 so that, during the measurement interval for the lowermost frequency bin, an output is produced by threshold detector 32 indicating that no signal of interest is present and thus, pursuant to the sequential detecting process criteria, the lowermost bin is dismissed and a "dismiss" is declared. A "dismiss" signal is coupled through OR gate 36, resetting time-out counter 41, and through OR gate 37, clearing or resetting summation accumulator 27. The "dismiss" signal output of threshold detector 32 is further coupled as a control input Ci to control circuit 100. This Ci "dimiss" indication control input is coupled via input line 122 and inverter 126 to the clock input of DISMISS counter 127. DISMISS counter 127 is configured to count five dismiss indications before registering an output, so that the above-described sequential detection signal presence measurement process is repeated four more times to certify the conclusion made on the lowermost frequency bin, whereupon DISMISS counter 127 supplies an output which sets DISMISS flip-flop 151. The change in state of the Q output of DISMISS flip-flop 151 is decoded by multiplexer control decoder 153, which supplies a new control code over control leads 164-166 to multiplexer 74. In response to this new control code, multiplexer 74 switches the connection between output terminal 74o and input terminal 74g to a connection between output terminal 74o and input terminal 74e. Input terminal 74e is coupled to the output of adder 73 which is a value representative of the sum of the contents of lag accumulator 75 and the output of divider 71. Since the output of divider 71 is representative of half the bit rate, the bit rate being supplied via line 70 from selector switch 54 and bit rate selector 58, adder 73 increases the contents of the lag accumulator 75 by a value equal to half the bit rate. This advance of the contents of lag accumulator 75 increments the center frequency to which the loop filter is tuned and thereby advances the center frequency of the channel monitored by the receiver. The contents of the lag accumulator are also supplied to comparators 91 and 92. In the present description, the operation is explained in conjunction with a frequency bin search from the lowermost limit of the range of frequency uncertainty in a direction of increasing frequency toward the uppermost limit. Therefore, of the two comparators 91 and 92, only comparator 91 has its output coupled to line 123 of control circuit 100, compartor 92 being decoupled therefrom. Since the upper frequency limit has not been reached, there is no change in state of the output from comparator 91 to control circuit 100.

With the contents of lag accumulator 75 having been advanced to the center frequency of the second lowermost bin, the local oscillator of the receiver circuitry is tuned to this second lowermost center frequency and the receiver begins monitoring this bin for the presence of signal in according with the sequential detection process. The series of steps described above for the lowermost bin is repeated for the second lowermost bin, and successively increasing bins, as necessary, until the output of summation accumulator 27 either causes upper threshold detector 33 to generate a "hit" signal or remains between the upper and lower threshold values for the duration of the interval timed by time-out counter 41. In the latter case, the generation of a carry by counter 41, which resets accumulator 27 via OR gate 37, is supplied as a "hit" signal to control circuit 100.

In the example chosen, shown in FIG. 1, a "hit" is first declared in the fifth lowermost frequency bin. Upon the generation of a "hit" by either threshold detector 33 or time-out counter 41, a "hit" signal is coupled to line 115 of control circuit 100, so that flip-flop FF1 becomes set, via inverters 111 and 112, and DISMISS counter 127 is cleared. The clock input of HIT counter 113 is coupled to the output of inverter 112, so that the number of times a "hit" is declared can be registered. HIT counter 113 serves the same purpose as DISMISS counter 127; i.e. it is used to verify the accuracy of the decision made by the signal presence detection circuitry by requiring that a determination of a "hit" be repeated a prescribed number of times, to be certain that a "hit" indication is not accidental. When HIT counter 113 has counted a prescribed number of "hit"s, it will supply an output to NAND gate 116. The other inputs of NAND gate 116 are derived from the Q output of flip-flop FF1 and from inverter 111, so that the output of NAND gate 116 will change state upon HIT counter 113 reaching capacity. The output of NAND gate 116 is inverted by inverter 130 and coupled to NAND gate 131. Since the other input of NAND gate 131 is coupled to the Q output of flip-flop FF2, which output is still in the "1" state, flip-flop FF2 still being reset, the output of NAND gate 131 goes low, thereby setting HIT flip-flop 145. Since flip-flop 145 is set, its $\overline{Q}$ output becomes a "1", causing a change in state of one of the inputs to decoder 153. The states of the inputs to decoder 153 now cause decoder 153 to supply a switching signal over code leads 164-166 to multiplexer 74, whereby multiplexer output 74o is coupled to multiplexer input 74c. Thus, the center frequency of the bin in which a "hit", representative of the presence of signal, has been verified and presently stored in lag accumulator 75 is supplied to the output 74o of the multiplexer 74.

As was described above, whenever a "hit" is registered flip-flop FF1 is set. When the Q output of flip-flop FF1 goes high, each of lines 155 and 156 goes high. Line 156 delivers a control signal to gate 79 causing output 79c to be switched from input 79a to input 79b, thereby coupling the output 74o of multiplexer 74 to the frequency memory 76. Therefore, the code presently contained in lag accumulator 75 ( and representative of the center frequency of the bin in which a "hit" was declared) is supplied to frequency memory 76 to be used during the subsequent bandwidth search and frequency sweep modes (MODES 2 and 3). The setting of flip-flop FF1 also causes the output line 161 from gate 138 to go low, whereby selector switch 54 connects its output 54c to bandwidth PROM 52 for conducting a bandwidth search in MODE 2.

BANDWIDTH SEARCH (MODE 2)

As was explained above, when flip-flop FF1 is set during MODE 1, control circuit output lines 155 and 156 go high. Line 156 switches gate 79 to cause the center frequency of the bin of interest stored in lag accumulator 75 to be coupled to frequency memory 76; line 155 clears the bandwidth step counter 51, so that PROM 52 supplies to line 70, via selector switch 54, a code representative of the bandwidth (BW) to be used during the present bandwidth search. In the present example, assuming a maximum available bandwidth of 100 KHz, a code corresponding to this bandwidth is coupled to adder 81 and subtractor 82 to be combined with the contents of frequency memory 76, so as to define upper and lower maximum extremities of the bandwidth established at the commencement of the bandwidth search mode. Thus, from adder 81 there is supplied a code representative of $f_c+(BW=100\ KHz)$, while at the output of subtractor 82 there is supplied a code representative of $f_c-(BW=100\ KHz)$. The bandwidth search or reduction is conducted as bit rate encoder 57 and offset PROM 61 vary the offset value which is used to establish the upper and lower thresholds for the sequential detection process, to be carried out in the same manner as described previously, but in response to changing values from PROM 52, as step counter 52 is advanced by control circuit 100.

More specifically, with flip-flop FF2 being in the reset state, its Q output is low, thereby disabling AND gate 135 and providing a low level to the input of NAND gate 134. As the clock supplied over line 101 changes from low to high, for the next processing cycle, the output of NAND gate 134 changes state. This clock is coupled through NAND gate 133 and over line 154 to input 51a of step counter 51. Thus, step counter 51 is sequentially advanced by the system clock to provide successive address codes by way of which PROM 52 is addressed. For each address, a prescribed bit rate code (corresponding to the selected bandwidth BW) is coupled via selector switch 54 to PROM 57 which, in turn, addresses offset table PROM 61 to establish the necessary offset. As was explained above, at the beginning of the bandwidth search, the offset may be established for a maximum bandwidth of 100 KHz about the bin center frequency $f_c$. The offset is supplied to multipliers 30 and 31 to establish lower and upper thresholds for the signal presence detection process. With the receiver having a bandwidth BW corresponding to the output of PROM 52 and being tuned to the center frequency $f_c$ defined by the contents of lag accumulator 75, quantizer 21 again converts received signal into digital codes supplied to I and Q channel accumulators 22 and 23, and the absolute values thereof are combined with the contents of summation accumulator 27 and offset register 62. Again, a "hit" or a "dismiss" is determined pursuant to the sequential detection process criteria, previously used during the bin search (MODE 1), described above. If a "dismiss" is verified by DISMISS counter 127, the output from DISMISS counter 127 is coupled via inverter 118 to AND gate 136, NOR gate 137, and NAND gate 133 to output line 154, to thereby supply to step counter 51 another advance or clock pulse. Each time step counter 51 is advanced to establish a new address for PROM 52, the net effect provided is a new code supplied over line 70 to the bit rate synthesizer, causing a reduction in the bandwidth of the loop filter by a prescribed value, e.g. corresponding to a prescribed number of dB in the loop filter characteristic. In the example described, this reduction corresponding to 2.1 dB. With each reduction in bandwidth, the signal power measurement process is repeated until a declared "hit" is verified by HIT counter 113 whereupon multipliexer control decoder 153 supplies a code over lines 164-166 which causes the output 74o of multiplexer 74 to be switched from input 74c to input 74g, or the lower limit output from comparator switch 88.

The lower limit output from comparator switch 88 is derived by gate circuit 86. Depending upon the state of flip-flop 94, gate circuit 86 will couple either the lower frequency limit from sweep selector 87 or the output of subtractor 82 to input 74g of multiplexer 74. The state of flip-flop 94 depends upon either the state of the limit select control line 162 from control circuit 100 or the output of comparator 84. As was described above, in conjunction with the description of control circuit 100 (FIG. 4), for MODES 2 and 3, depending upon the magnitude of the bandwidth code supplied by selector switch 54, the output of AND gate 144 may be high, thereby not affecting the states of flip-flops 93 and 94. As a result, the states of flip-flops 93 and 94 will depend upon the outputs of comparators 83 and 84. On the other hand, if the magnitude of the bandwidth code, relative to the center frequency of the bin of interest, is such that the system might be caused to carry out an investigation which would monitor frequencies outside the frequency uncertainty range, line 162 goes low, thereby directly resetting flip-flop 93 and setting flip-flop 94. When flip-flop 93 is reset, the upper limit supplied at the output of gate circuit 85 is the upper frequency limit $f_{UL}$ of the frequency uncertainty range stored in sweep selector 87. When flip-flop 94 is set, the lower limit supplied at the output of gate circuit 86 is the lower frequency limit $f_{LL}$ of the frequency uncertainty range stored in sweep selector 87. During the bandwidth search (MODE 2), although the loop filter is initially tuned to the center frequency of the bin in which a signal of interest has been located during MODE 1, the loop filter circuitry may drift to another frequency having a stronger signal, so that the contents of the lag accumulator which forms part of the loop filter may change. Namely, where the bandwidth is very wide, it is possible that the receiver might attempt to track a very strong frequency that falls within its bandwidth but lies outside the range of frequency uncertainty. This condition may occur where the center frequency of the frequency bin of interest is close to one of the upper or lower limits of the frequency uncertainty range. For a bin search in the direction of increasing frequency (as assumed in the present example), the frequency bin of interest would have to be located near the upper end of the range. Conversely, for the bin search in the direction of decreasing frequency, the frequency bin of interest would have to be located near the lower end of the range. Thus, during MODES 2 and 3, for very wide bandwidth code, the output of AND gate 144 goes low causing the frequency limits to be defined by the contents of sweep limit selector 87. If the contents of the lag accumulator drift to one of these limits, an output will be generated by one of comparators 91 and 92. (In the present example, the output would be generated by positive sweep comparator 91.)

When this happens, a control signal is supplied over line 123 to control circuit 100. Via delay circuit 186, there is a change in state of the inputs of multiplexer control decoder 53, so that the outputs 164-166 couple a switching code over link 77 to multiplexer 74. The contents of frequency memory 76 are coupled via input 74b to output 74o, so that the code in lag accumulator 75 is returned to a value corresponding to the center frequency of the bin of interest. In this manner, the loop filter is prevented by attempting to track signals outside the frequency range.

Where the bandwidth is of a value that will not cause the system to attempt to monitor frequencies outside the range of uncertainty, the states of flip-flops 93 and 94 are permitted to be dependent upon the outputs of comparators 83 and 84. Comparators 83 and 84 compare the outputs of adder 81 ($f_c$+BW) and subtractor 82 ($f_c$−BW) with the respective upper and lower frequency limits supplied by sweep limit selector 87. If the value $f_c$+BW drops below the upper frequency limit $f_{UL}$, comparator 83 sets flip-flop 93, causing the output of gate circuit 85 to become the value $f_c$+BW; otherwise, the output of gate circuit 85 is the upper limit UL. Similarly, if the value $f_c$−BW is lower than the lower frequency limit, flip-flop 94 will be set by comparator 84, causing gate circuit 86 to couple the lower frequency limit $f_{LL}$ at its output; otherwise the output of gate circuit 86 is the value of $f_c$−BW. These values are used to establish the limits of the frequency sweep conducted in MODE 3.

Upon the verification of a "hit" by HIT counter 113, HIT flip-flop 145 is set, causing its Q output to go high, thereby changing the code supplied to multiplexer control decoder 153. Decoder 153 changes the states of leads 164-166 to supply a control code to multiplexer 74 causing output 74o to be coupled to the lower frequency limit input 74g. Input 74g is coupled to the output of gate circuit 86. As was explained above, the output of gate circuit 86 will be either $f_c$−BW or $f_{LL}$, which ever is higher. Namely, the sweep in MODE 3 will commense at the lowermost limit limit of the bandwidth at which phase lock is expected to be acquired, provided that lowermost frequency limit does not lie outside the frequency uncertainty range. If $f_c$−BW is less than $f_{LL}$, then $f_{LL}$ is used as the starting frequency in the sweep mode (MODE 3). In the present example, it will be assumed that $f_c$−BW>$f_{LL}$, so that the code placed in lag accumulator 75 via multiplexer 74 corresponds to $f_c$−BW.

FREQUENCY SWEEP (MODE 3)

Upon verification of a "hit" by HIT counter 113, HIT flip-flop 145 is set, causing its Q output to go high. With the Q output of HIT flip-flop 145 high, a signal is coupled via NAND gate 108 to set flip-flop FF2. The Q output of flip-flop FF2 goes high, supplying enabling inputs to gate 135 and 152, while the $\overline{Q}$ output of flip-flop FF2 goes low, disabling gate 117. The corresponding change in the inputs to multiplexer control decoder 153 causes decoder 153 to supply a code over lines 164-166 to link 77, whereby output 74o of multiplexer 74 is connected to input 74a, or the output of adder 72. Multiplexer 48 is switched by multiplexer decoder 153 to couple the code supplied by sweep register 47 at input 48a to output 48c and one input of adder 72. Adder 72 adds to the contents of lag accumulator 75 the sweep code from supplied sweep register 47 and coupled to output 48c of multiplexer 48. The value in sweep register 47 is sequentially advanced from zero to cause the contents of lag accumulator 75 to be increased from the lower frequency limit (here, unitially $f_c-BW$) toward the upper limit ($f_c+BW$ or $f_{UL}$, whichever is lower) of the bandwidth. During this sweep, the phase lock circuitry of the receiver, including lock detector 45, coupled to normalizer 43, attempts to lock onto the transmitted signal $f_T$ that is contained in the bandwidth being swept. As the band from $f_c-BW$ to $f_c+BW$ is swept, the sequential detection process is again carried out, and the incremented contents of lag accumulator 75 are compared with the upper frequency limit of the sweep provided at the output of gate circuit 85. Assuming that the upper frequency limit $f_{UL}$ of the original frequency uncertainty range supplied by sweep limit selector 87 is greater than the reduced bandwidth upper limit $f_c+BW$ at the output of adder 81, then, as explained above, the output of gate circuit 86 will be $f_c+BW$. Should the sweep reach the upper frequency limit $f_c+BW$ without phase lock having been acquired, comparator 91 will deliever an output to control circuit 100 to cause an advance of the bandwidth step counter 51 and, after a delay provided by delay circuit 186, will cause mutliplexer 74 to reload lag accumulator 75 with a new lower frequency limit $f_c-BW'$ supplied by gate circuit 86 from subtractor 82, representative of a 2.1 dB decrease in the signal power characteristic of the loop filter. Of course, the upper frequency limit has been also reduced to a new value $f_c+BW'$, due to the advance of bandwidth step counter addressing a new memory location in PROM 52, from which memory location the reduced (by 2.1 dB) bandwidth code BW' is derived. In response thereto, the output of adder 81 is $f_c+BW'$, so that this value $f_c+BW'$ is coupled to the output of adder 85 to be used as the new upper limit of the frequency sweep. The frequency sweep using the sequential detection process is now successively repeated, as necessary, beginning at new lower limit corresponding to the 2.1 dB step in bandwidth reduction and for each sweep the phase lock circuit attempts to lock onto the transmitted frequency $f_T$. (In practice, it has been found that phase lock usually occurs in the initial sweep.)

Once phase lock is achieved, the contents of lag accumulator 75 will correspond to the transmitted frequency $f_T$ and phase lock detector 45 will supply an output to line 102 of control circuit 100 which will set either flip-flop FF4 or FF5, depending upon the relationship between the bit rate and the bandwidth code supplied by bandwidth PROM 52. Also, the contents of sweep register 47 are no longer advanced, and multiplexer decoder 154 will cause multiplexer 48 to switch to input 48b from carrier phase detector 44. If the bandwidth is greater than the bit rate, bandwidth reduction (MODE 4) is carried out; if the bandwidth is less than or equal to the bit rate, final lock (MODE 5) is effected.

BANDWIDTH REDUCTION (MODE 4)

Assuming that the bandwidth at which phase lock on the transmitted signal $f_T$ was achieved during the frequency sweep (MODE 3) is greater than the bit rate BR (supplied by bit rate selector 58), comparator 55 will have continued to supply an output identified as BW>BR to line 104 of control circuit 100 during the previous modes. Line 104 has therefore been supplying a high enabling level to one of the inputs of AND gate 181. When the output of lock detector 45 goes high upon achieving phase lock, line 102 goes high so that AND gate 181 supplies a signal to set flip-flop FF4.

This causes the Q output of flip-flop FF4 to go high, so that AND gate 119 becomes enabled and a bandwidth step pulse from lock detector 45 is coupled via AND gate 119 to NOR gate 137, to thereby supply a signal via NAND gate 133, causing a bandwidth step signal to be applied over output line 154 to input 51a of the bandwidth step counter 15, thereby advancing the address supplied to PROM 52. Comparator 55 compares the new bandwidth code output of PROM 52 with the bit rate supplied from bit rate selector 58. As long as the bandwidth exceeds the bit rate, the Q ouput of flip-flop FF4 continues to enable AND gate 119, so that a bandwidth reduction pulse from the lock detector can be coupled through AND gate 199 and onto output line 154. The bandwidth reduction pulse signals produced by lock detector 45 are produced at a rate slow enough to enable the phase lock loop to continue tracking the monitored frequency $f_T$. The code in the lag accumulator 75 is updated as necessary by the output of adder 72 which receives, via multiplexer 48, the output of carrier phase detector 44.

As the bandwidth or dump rate is reduced, it eventually becomes less than or equal to the bit rate, whereupon comparator 55 produces an output that is coupled over line 103 to NAND gate 182, representing BR≧BW. Thus, the state of line 103 goes high, while the state of line 104, which corresponds to BR<BW, goes low. The output from comparator 55 indicating that the bandwidth has been reduced to a value that is less than or equal to the bit rate is thus coupled through gate 182 and inverter 193 to set flip-flop FF5.

FINAL LOCK (MODE 5)

When flip-flop FF5 is set, its $\overline{Q}$ output goes low, causing gate 138 to couple an output via line 161 to the control input of selector switch 54. Switch 54 responds to the change in state of its control input to connect output 54c to input 54a. The input to the bit synchronizer of the receiver loop filter circuitry now corresponds exactly to the bit rate of the data, while the contents of the lag accumulator 75 are updated by the output of carrier phase detector 44. The parameters by which the characteristics of the loop filter are defined are now established in accordance with the data rate and the frequency of the signal being tracked, whereby the output of the receiver is available for data transfer.

As will be appreciated from the foregoing description, the use of the sequential detection process in the signal location and acquisition system of the present invention permits the processing and evaluation circuitry to detect and lock onto a narrowband signal in a very rapid manner, by responding essentially only to signal strength. The threshold-comparison technique of the sequential detection process permits decisions to be made very rapidly for strong or weak signals, so that a transmitted narrowband signal can be rapidly acquired. Even where signal-like noise prolongs the decision process relative to those for strong or weak signals, the overall decision process is more rapid than conventional detection techniques.

While we have shown and described one embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

We claim:

1. In a communication system, wherein a transmitted signal containing data to be recovered and situated within a range of frequency uncertainty is located and acquired, said system including a receiver having a sequential detection arrangement for comparing an input signal to prescribed upper and lower thresholds and generating an output signal representative of the relationship of said input to said thresholds, the improvement comprising the steps of:
   (a) coupling received signals as an input signal to said sequential detection arrangement and selectively tuning said receiver to a prescribed bandwidth containing said transmitted signal in response to the output of said sequential detection arrangement; and
   (b) coupling received signals within said prescribed bandwidth to said sequential detection arrangement and selectively changing the frequency response characteristics of said receiver within said prescribed bandwidth in response to the output signal produced by said sequential detection arrangement, so as to enable said receiver to lock onto and acquire said transmitted signal.

2. The improvement according to claim 1, further comprising the step of (c) sweeping the center frequency across the frequency bandwidth defining the frequency response characteristics to which said receiver has been changed in response to the output signal produced by said sequential detection arrangement in step (b), so that said receiver locks onto said transmitted signal.

3. The improvement according to claim 2, further comprising the step of (d) reducing the bandwidth of said receiver to correspond to the data rate of said locked onto transmitted signal.

4. The improvement according to claim 1, wherein, within said sequential detection arrangement, upon the input signal thereto exceeding said prescribed upper threshold, said output signal represents a first state and, upon said input signal thereto dropping below said prescribed lower threshold, said output signal represents a second state, the selective tuning of the receiver and selective changing of the frequency response characteristics of the receiver being dependent upon which of said first and second states said output signal represents.

5. The improvement according to claim 4, wherein, within said sequential detection arrangement, upon said input signal thereto having remained between said thresholds for a prescribed period of time, said output signal represents said first state.

6. The improvement according to claim 5, further comprising the step of (c) sweeping the center frequency across the frequency bandwidth defining the frequency response characteristics to which said receiver has been changed in response to the output signal produced by said sequential detection arrangement in step (b), so that said receiver locks onto said transmitted signal.

7. The improvement according to claim 6, further comprising the step of (d) reducing the bandwidth of said receiver to correspond to the data rate of said locked onto transmitted signal.

8. In a communication system, wherein a transmitted signal containing data to be recovered and situated within a range of frequency uncertainty is located and acquired, said system including a receiver having a sequential detection arrangement for comparing an input signal to prescriber upper and lower thresholds and generating an output signal representative of the relationship of said input to said thresholds, the improvement comprising:
   means for coupling received signals as an input signal to said sequential detection arrangement and selectively tuning said receiver to a prescribed bandwidth containing said transmitted signal in response to the output of said sequential detection arrangement; and
   means for coupling received signals within said prescribed bandwidth to said sequential detection arrangement and selectively changing the frequency response characteristics of said receiver within said prescribed bandwidth in response to the output signal produced by said sequential detection arrangement, so as to enable said receiver to lock onto and acquire said transmitted signal.

9. The improvement according to claim 8, further comprising
   means for sweeping the center frequency across the frequency bandwidth defining the frequency response characteristics to which said receiver has been changed in response to the output signal produced by said sequential detection arrangement so that said receiver locks onto said transmitted signal.

10. The improvement according to claim 9, further comprising means for reducing the bandwidth of said receiver to correspond to the data rate of said locked onto transmitted signal.

11. The improvement according to claim 8, wherein within said sequential detection arrangement, upon the input signal thereto exceeding said prescribed upper threshold, said output signal represents a first state and, upon said input signal thereto dropping below said prescribed lower threshold, said output signal represents a second state, the selective tuning of the receiver and selective changing of the frequency response characteristics of the receiver being dependent upon which of said first and second states said output signal represents.

12. The improvement according to claim 11, wherein within said sequential detection arrangement, upon said input signal thereto having remained between said thresholds for a prescribed period of time, said output signal represents said first state.

13. In a communication system, a method of acquiring a transmitted signal, containing data to be recovered, the frequency of which transmitted signal within a range of frequency uncertainty is unknown, comprising the steps of:
   (a) dividing said range of frequency uncertainty into a plurality of adjacent frequency bins;
   (b) monitoring, through a sequential detection arrangement wherein input signals are compared to prescribed upper and lower thresholds and an output is produced representative of the relationship of said input signals to said thresholds, at least one of said frequency bins for the presence of a transmitted signal;
   (c) upon detecting, in step (b), the presence of a transmitted signal in that bin, determining, in accordance with said sequential detection arrangement, the widest bandwidth at which a phase lock loop can achieve phase lock between said transmitted frequency and a variable reference frequency; and
   (d) varying said reference frequency so as to enable said phase lock loop to acquire phase lock between said transmitted frequency and said variable reference frequency.

14. A method according to claim 13, further comprising the step of:
(e) upon said phase lock loop acquiring phase lock in step (d), converting the signal bandwidth for said phase lock loop to a bandwidth corresponding to the data rate of said data to be recovered, whereby synchronization with said data and data recovery can be effected.

15. A method according to claim 13, wherein said communication system contains a carrier recovery loop incorporating said phase lock loop and a carrier loop filter through which recovered signals are coupled, and wherein step (c) comprises:
(c1) comparing the signal monitored in a bin in step (b) with a set of reference values corresponding to a prescribed bandwidth of said carrier loop filter; and
(c2) reducing the bandwidth of said carrier loop filter in response to the results of comparing step (c1) indicating that said prescribed bandwidth of said carrier loop filter is wider than that at which phase lock can be achieved.

16. A method according to claim 13, wherein said communication system contains a carrier recovery loop incorporating said phase lock loop and a carrier loop filter through which received signals are coupled, and wherein step (d) comprises:
(d1) sweeping said reference frequency, and thereby the center frequency to which said carrier loop filter is tuned, across said widest bandwidth determined in step (c); and
(d2) upon completing step (d1), without said phase lock loop having acquired phase lock with said transmitted frequency, reducing the bandwidth of said carrier loop filter and repeating step (d1) and, if necessary, step (d2) until phase lock is achieved.

17. A method according to claim 15, wherein step (d) comprises:
(d1) sweeping said reference frequency, and thereby the center frequency to which said carrier loop filter is tuned, across said widest bandwidth determined in step (c); and
(d2) upon completing step (d1), without said phase lock loop having acquired phase lock with said transmitted frequency, reducing the bandwidth of said carrier loop filter and repeating step (d1) and, if necessary, step (d2) until phase lock is achieved.

18. A method according to claim 13, wherein step (b) comprises:
(b1) comparing the signal monitored in said at least one of said frequency bins with upper and lower thresholds, said upper threshold being of a value indicative of the presence of a transmitted signal in said at least one of said bins, and said lower threshold being of a value indicative of the absence of a transmitted signal in said at least one of said bins; and
(b2) detecting that the bin, the signal in which is being monitored, contains a transmitted signal upon said monitored signal exceeding said upper threshold, or detecting that said bin does not contain a transmitted signal upon said monitored signal being below said lower threshold.

19. A method according to claim 13, wherein step (b) comprises monitoring the signal in said frequency bins in succession across said range of frequency uncertainty until the signal in a monitored bin is detected to be sufficient to indicate the presence of a transmitted signal in that bin.

20. A method according to claim 18, wherein step (b2) further comprises:
detecting that said bin contains a transmitted signal upon said monitored signal being of a value between said upper and lower thresholds for a prescribed period of time.

21. A method according to claim 16, wherein step (d1) comprises confining the sweep of said reference frequency to said range of frequency uncertainty.

22. A method according to claim 17, wherein step (d1) comprises confining the sweep of said reference frequency to said range of frequency uncertainty.

23. A method according to claim 20, wherein step (b) further comprises the step of (b3) repeating steps (b1), (b2), and (b3) a plurality of times as a verification procedure and generating an indication of whether or not the bin, the signal in which is being monitored, contains or does not contain a transmitted signal.

24. In a communication system having a carrier recovery loop incorporating a phase lock loop and a carrier loop filter through which received signals are coupled, a method of acquiring a transmitted signal, containing data to be recovered, the frequency of which transmitted signal within a range of frequency uncertainty is unknown, comprising the steps of:
(a) dividing said range of frequency uncertainty into a plurality of adjacent frequency bins;
(b) monitoring, through a sequential detection arrangement wherein input signals are compared to prescribed upper and lower thresholds and an output representative of the relationship of said input signals to said thresholds is produced thereby, said frequency bins in succession across said range of frequency uncertainty until a monitored bin is detected to contain a transmitted signal;
(c) upon detecting the presence of a transmitted signal in a bin, determining, in accordance with said sequential detection arrangement, the widest bandwidth of said carrier loop filter which will enable said phase lock loop to achieve phase lock between said transmitted signal and a variable reference frequency; and
(d) varying said reference frequency and thereby the center frequency to which said carrier loop filter is tuned so as to enable said phase lock loop to acquire phase lock between said transmitted signal and said variable reference frequency.

25. A method according to claim 24, wherein the difference between the center frequencies of adjacent bins is equal to half the data rate of said data to be recovered and wherein, during step (b) the bandwidth of said carrier loop filter is established in accordance with the data rate of said data to be recovered.

26. A method according to claim 24, wherein step (c) comprises:
(c1) comparing the signal monitored in a bin in step (b) with a set of reference values corresponding to a prescribed bandwidth of said carrier loop filter; and
(c2) reducing the bandwidth of said carrier loop filter in response to the results of comparing step (c1) indicating that said prescribed bandwidth of said carrier loop filter is wider than that at which phase lock can be achieved.

27. A method according to claim 24, further comprising the step of:
  (e) upon said phase lock loop acquiring phase lock in step (d), converting the bandwidth of said carrier loop filter to a bandwidth corresponding to the data rate of said data to be recovered, whereby synchronization with said data and data recovery can be effected.

28. A method according to claim 24, wherein step (b) comprises:
  (b1) comparing the signal monitored in a respective one of said frequency bins with upper and lower thresholds, said upper threshold being of a value indicative of the presence of a transmitted signal in said respective one of said bins, and said lower threshold being of a value indicative of the absence of a transmitted signal in said respective one of said frequency bins; and
  (b2) detecting that said respective one of said bins contains a transmitted signal upon said monitored signal exceeding said upper threshold, or detecting that said respective one of said bins does not contain a transmitted signal upon said monitored signal being below said lower threshold.

29. A method according to claim 28, wherein step (b2) further comprises detecting that said respective one of said frequency bins contains a transmitted signal upon said monitored signal being of a value between said upper and lower thresholds for a prescribed period of time.

30. A method according to claim 28, wherein said upper and lower thresholds are defined in accordance with the bandwidth of said carrier loop filter.

31. A method according to claim 26, wherein step (c1) comprises:
  (c1-i) comparing the signal monitored for the frequency bin detected in step (b) to contain a transmitted signal with upper and lower threshold levels, said upper threshold level being of a value indicating that the loop filter bandwidth is sufficiently narrow for said phase lock loop to acquire said transmitted signal, and said lower threshold level being of a value indicating that the loop filter bandwidth is not sufficiently narrow for said phase lock loop to acquire said transmitted signal; and
  (c1-ii) detecting that the loop filter bandwidth is sufficiently narrow for said phase lock loop to acquire said transmitted signal upon said monitored signal exceeding said upper threshold level or detecting that the loop filter bandwidth is not sufficiently narrow for said phase lock loop to acquire said transmitted signal upon said monitored signal being below said lower threshold level.

32. A method according to claim 31, wherein step (c1) further comprises:
  (c1-ii) detecting that said loop filter bandwidth is sufficiently narrow for said phase lock loop to acquire said transmitted signal upon said monitored signal being of a value between said upper and lower threshold levels for a prescribed period of time.

33. A method according to claim 31, wherein said upper and lower threshold levels are defined in accordance with the bandwidth of said carrier loop filter.

34. A method according to claim 33, wherein step (c2) comprises adjusting said threshold levels in accordance with a prescribed reduction in the bandwidth of said carrier loop filter in response to step (c1-ii) detecting that the loop filter bandwidth is not sufficiently narrow for said phase lock loop to acquire said transmitted signal.

35. A method according to claim 34, wherein step (c1) further comprises:
  (c1-iii) detecting that said loop filter bandwidth is sufficiently narrow for said phase lock loop to acquire said transmitted signal upon said monitored signal being of a value between said upper and lower threshold levels for a prescribed period of time.

36. A method according to claim 35, wherein step (c) further comprises:
  (c3) repeating steps (c1) and (c2) as necessary until one of steps (c1-ii) and (c1-ii) detects that the loop filter bandwidth is sufficiently narrow for said phase lock loop to acquire said transmitted signal.

37. A method according to claim 24, wherein step (d) comprises:
  (d1) sweeping said reference frequency, and thereby the center frequency to which said carrier loop filter is tuned, across said widest bandwidth determined in step (c); and
  (d2) upon completing step (d1), without said phase lock loop having acquired phase lock with said transmitted signal, reducing the bandwidth of said carrier loop filter and repeating step (d1) and, if necessary, step (d2) until phase lock is achieved.

38. A method according to claim 29, wherein step (c1) comprises:
  (c1-i) comparing the signal monitored for the frequency bin detected in step (b) to contain a transmitted signal with upper and lower threshold levels, said upper threshold level being of a value indicating that the loop filter bandwidth is sufficiently narrow for said phase lock loop to acquire said transmitted signal, and said lower threshold level being of a value indicating that the loop filter bandwidth is not sufficiently narrow for said phase lock loop to acquire said transmitted signal; and
  (c1-ii) detecting that the loop filter bandwidth is sufficiently narrow for said phase lock loop to acquire said transmitted signal upon said monitored signal exceeding said upper threshold level or detecting that the loop filter bandwidth is not sufficiently narrow for said phase lock loop to acquire said transmitted signal upon said monitored signal being below said lower threshold level.

39. A method according to claim 38, wherein step (c1) further comprises:
  (c1-ii) detecting that said loop filter bandwidth is sufficiently narrow for said phase lock loop to acquire said transmitted signal upon said monitored signal being of a value between said upper and lower threshold levels for a prescribed period of time.

40. A method according to claim 39, wherein step (c2) comprises adjusting said threshold levels in accordance with a prescribed reduction in the bandwidth of said carrier loop filter in response to step (c1-ii) detecting that the loop filter bandwidth is not sufficiently narrow for said phase lock loop to acquire said transmitted signal.

41. A method according to claim 40, wherein step (c) further comprises:
  (c3) repeating steps (c1) and (c2) as necessary until one of steps (c1-ii) and (c1-iii) detects that the loop filter bandwidth is sufficiently narrow for said phase lock loop to acquire said transmitted signal.

42. A method according to claim 28, wherein step (d) comprises:
(d1) sweeping said reference frequency, and thereby the center frequency to which said carrier loop filter is tuned, across said widest bandwidth determined in step (c); and
(d2) upon completing step (d1), without said phase lock loop having acquired phase lock with said transmitted signal, reducing the bandwidth of said carrier loop filter and repeating step (d1) and, if necessary, step (d2) until phase lock is achieved.

43. A method according to claim 38, wherein step (d) comprises:
(d1) sweeping said reference frequency, and thereby the center frequency to which said carrier loop filter is tuned, across said widest bandwidth determined in step (c); and
(d2) upon completing step (d1), without said phase lock loop having acquired phase lock with said transmitted signal, reducing the bandwidth of said carrier loop filter and repeating step (d1) and, if necessary, step (d2) until phase lock is achieved.

44. A method according to claim 39, wherein said upper and lower thresholds are defined in accordance with the bandwidth of said carrier loop filter.

45. A method according to claim 40, wherein said upper and lower threshold levels are defined in accordance with the bandwidth of said carrier loop filter.

46. A method according to claim 42, wherein step (d1) comprises confining the sweep of said reference frequency to said range of frequency uncertainty.

47. A method according to claim 43, wherein step (d1) comprises confining the sweep to said reference frequency to said range of frequency uncertainty.

48. A method according to claim 42, further comprising the step of:
(e) upon said phase lock loop acquiring phase lock in step (d), converting the bandwidth of said carrier loop filter to a bandwidth corresponding to the data rate of said data to be recovered, whereby synchronization with said data and data recovery can be effected.

49. A method according to claim 33, further comprising the step of:
(e) upon said phase lock loop acquiring phase lock in step (d), converting the bandwidth of said carrier loop filter to a bandwidth corresponding to the data rate of said data to be recovered, whereby synchronization with said data and data recovery can be effected.

50. A method according to claim 29, wherein step (b) further comprises the step of (b3) repeating steps (b1), (b2), and (b3) a plurality of times as a verification procedure and generating an indication of whether or not the bin, the signal in which is being monitored, contains or does not contain a transmitted signal.

51. In a communication system, a receiver arrangement for acquiring a transmitted signal, containing data to be recovered, the frequency of which transmitted signal within a range of frequency uncertainty is unknown, comprising:
first means for monitoring, through a sequential detection arrangement wherein input signals are compared to prescribed upper and lower thresholds and an output representative of the relationship of said input signals to said thresholds is produced thereby, at least one of a plurality of adjacent frequency bins into which said range of frequency uncertainty is divided for the presence of a transmitted signal;
second means, coupled to said first means and responsive to said first means detecting the presence of a transmitted signal in a monitored bin, for determining, in accordance with said sequential detection arrangement, the widest bandwidth at which a phase lock loop can achieve phase lock between said transmitted signal and a variable reference frequency; and
third means, coupled to said first and second means, for varying said reference frequency so as to enable said phase lock loop to acquire phase lock between said transmitted signal and said variable reference frequency.

52. A receiver arrangement according to claim 51, further comprising fourth means, coupled to said third means, and responsive to said phase lock loop acquiring phase lock, for converting the signal bandwidth for said phase lock loop to a bandwidth corresponding to the data rate of said data to be recovered, whereby synchronization with said data and data recovery can be effected.

53. A receiver arrangement according to claim 51, wherein said communication system contains a carrier recovery loop incorporating said phase lock loop and a carrier loop filter through which received signals are coupled, and wherein said second means comprises:
means for comparing the signal monitored in a bin with a set of reference values corresponding to a prescribed bandwidth of said carrier loop filter; and
means for reducing the bandwidth of said carrier loop filter in response to the output of said comparing means indicating that said prescribed bandwidth of said carrier loop filter is wider than that at which phase lock can be achieved.

54. A receiver arrangement according to claim 51, wherein said communication system contains a carrier recovery loop incorporating said phase lock loop and a carrier loop filter through which received signals are coupled, and wherein said third means comprises:
means for sweeping said reference frequency, and thereby the center frequency to which said carrier loop filter is tuned, across said widest bandwidth determined by said third means; and
means, responsive to said sweeping means having completed its sweep without said phase lock loop having acquired phase lock with said transmitted signal, for reducing the bandwidth of said carrier loop filter and causing said reference frequency to be swept and, if necessary, said bandwidth to be reduced, respectively, until phase lock is achieved.

55. A receiver arrangement according to claim 53, wherein said third means comprises:
means for sweeping said reference frequency, and thereby the center frequency to which said carrier loop filter is tuned, across said widest bandwidth determined by said third means; and
means, responsive to said sweeping means having completed its sweep without said phase lock loop having acquired phase lock with said transmitted signal, for reducing the bandwidth of said carrier loop filter and causing said reference frequency to be swept and, if necessary, said bandwidth to be reduced, respectively, until phase lock is achieved.

56. A receiver arrangement according to claim 51, wherein said first means comprises:

means for comparing the signal monitored in said at least one of said frequency bins with upper and lower thresholds, said upper threshold being of a value indicative of the presence of a transmitted signal in said at least one of said bins, and said lower threshold being of a value indicative of the absence of a transmitted signal in said at least one of said bins; and means, coupled to said comparing means, for detecting that the bin, the signal in which is being monitored, contains a transmitted signal upon said monitored signal exceeding said upper threshold, or for detecting that said bin does not contain a transmitted signal upon said monitored signal being below said lower threshold.

57. A receiver arrangement according to claim 51, wherein first means comprises means for monitoring the signal in said frequency bins in succession across said range of frequency uncertainty until the signal in a monitored bin is detected to be sufficient to indicate the presence of a transmitted signal in that bin.

58. A receiver arrangement according to claim 56, wherein said first means further comprises:

means for detecting that said bin contains a transmitted signal upon said monitored signal being of a value between said upper and lower thresholds for a prescribed period of time.

59. A receiver arrangement according to claim 54, wherein said third means further comprises:

means for confining the sweep of said reference frequency to said range for frequency uncertainty.

60. A receiver arrangement according to claim 55, wherein said third means further comprises:

means for confining the sweep of said reference frequency to said range of frequency uncertainty.

61. A receiver arrangement according to claim 58, wherein said first means further comprises means for causing said monitoring and detecting means to repeat their operations a plurality of times as a verification procedure, and thereafter generating an indication of whether or not the bin, the signal in which is being monitored, contains or does not contain a transmitted signal.

62. In a communication system having a carrier recovery loop incorporating a phase lock loop and a carrier loop filter through which received signals are coupled, a receiver arrangement for acquiring a transmitted signal containing data to be recovered, the frequency of which transmitted signal within a range of frequency uncertainty is unknown, comprising:

first means for monitoring, through a sequential detection arrangement wherein input signals are compared to prescribed upper and lower thresholds and an output representative of the relationship of said input signals to said thresholds is produced thereby, frequency bins in succession across said range of frequency uncertainty until a monitored bin is detected to contain a transmitted signal;

second means, responsive to said first means detecting the presence of a transmitted signal in a bin, for determining, in accordance with said sequential detection arrangement, the widest bandwidth of said carrier loop filter which will enable said phase lock loop to achieve phase lock between said transmitted signal and a variable reference frequency; and third means, coupled to said second means, for varying said reference frequency and thereby the center frequency to which said carrier loop filter is tuned so as to enable said phase lock loop to acquire phase lock between said transmitted signal and said variable reference frequency.

63. A receiver arrangement according to claim 62, wherein the difference between the center frequencies of adjacent bins is equal to half the data rate of said data to be recovered, and wherein said first means includes means for setting the bandwidth of said carrier loop filter in accordance with the data rate of said data to be recovered.

64. A receiver arrangement according to claim 62, wherein said second means comprises:

means for comparing the signal monitored in a bin with a set of reference values corresponding to a prescribed bandwidth of said carrier loop filter; and means for reducing the bandwidth of said carrier loop filter in response to the output of said comparing means indicating that said prescribed bandwidth of said carrier loop filter is wider than that at which phase lock can be achieved.

65. A receiver arrangement according to claim 62, further comprising:

fourth means, coupled to said third means, and responsive to said phase lock loop acquiring phase lock, for converting the bandwidth of said carrier loop filter to a bandwidth corresponding to the data rate of said data to be recovered, whereby synchronization with said data and data recovery can be effected.

66. A receiver arrangement according to claim 62, wherein said first means comprises:

means for comparing the signal monitored in a respective one of said frequency bins with upper and lower thresholds, said upper threshold being of a value indicative of the presence of a transmitted signal in said respective one of said bins, and said lower threshold being of a value indicative of the absence of a transmitted signal in said respective one of said frequency bins; and means for detecting that said respective one of said bins contains a transmitted signal upon said monitored signal exceeding said upper threshold, or detecting that said respective one of said bins does not contain a transmitted signal upon said monitored signal being below said lower threshold.

67. A receiver arrangement according to claim 66, wherein said first means further comprises:

means for detecting that said respective one of said frequency bins contains a transmitted signal upon said monitored signal being of a value between said upper and lower thresholds for a prescribed period of time.

68. A receiver arrangement according to claim 66, wherein said upper and lower thresholds are defined in accordance with the bandwidth of said carrier loop filter.

69. A receiver arrangement according to claim 64, wherein said second means comprises:

means for comparing the signal monitored for the frequency bin detected to contain a transmitted signal with upper and lower threshold levels, said upper threshold level being of a value indicating that the loop filter bandwidth is sufficiently narrow for said phase lock loop to acquire said transmitted signal and said lower threshold level being of a value indicating that the loop filter bandwidth is not sufficiently narrow for said phase lock loop to acquire said transmitted signal; and means for detecting that the loop filter bandwidth is sufficiently narrow for said phase lock loop to acquire said transmitted signal, upon said monitored signal exceeding said upper threshold level, or detecting that the loop filter bandwidth is not sufficiently narrow for said phase lock loop to acquire said transmitted signal upon said monitored signal being below said lower threshold level.

70. A receiver arrangement according to claim 69, wherein said second means further comprises:

means for detecting that said loop filter bandwidth is sufficiently narrow for said phase lock loop to acquire said transmitted signal upon said monitored signal being of a value between said upper and lower threshold levels for a prescribed period of time.

71. A receiver arrangement according to claim 69, wherein said upper and lower threshold levels are defined in accordance with the bandwidth of said carrier loop filter.

72. A receiver arrangement according to claim 71, wherein said second means further comprises:

means for adjusting said threshold levels in accordance with a prescribed reduction in the bandwidth of said carrier loop filter in response to said detecting means detecting that the loop filter bandwidth is not sufficiently narrow for said phase lock loop to acquire said transmitted signal.

73. A receiver arrangement according to claim 72, wherein said second means further comprises:

means for detecting that said loop filter bandwidth is sufficiently narrow for said phase lock loop to acquire said transmitted signal upon said monitored signal being of a value between said upper and lower threshold levels for a prescribed period of time.

74. A receiver arrangement according to claim 73, wherein said second means further comprises:

means for causing the operation of said comparing and reducing means to be repeated as necessary until one of said detecting means detects that the loop filter bandwidth is sufficiently narrow for said phase lock loop to acquire said transmitted signal.

75. A receiver arrangement according to claim 62, wherein said third means comprises:

means for sweeping said reference frequency, and thereby the center frequency to which said carrier loop filter is tuned, across said widest bandwidth determined by said third means; and means, responsive to said sweeping means having completed its sweep without said phase lock loop having acquired phase lock with said transmitted signal, for reducing the bandwidth of said carrier loop filter and causing said reference frequency to be swept and, if necessary, said bandwidth to be reduced, respectively, until phase lock is achieved.

76. A receiver arrangement according to claim 67, wherein said second means comprises:

means for comparing the signal monitored for the frequency bin detected to contain a transmitted signal with upper and lower threshold levels, said upper threshold level being of a value indicating that the loop filter bandwidth is sufficiently narrow for said phase lock loop to acquire said transmitted signal and said lower threshold level being of a value indicating that said loop filter bandwidth is not sufficiently narrow for said phase lock loop to acquire said transmitted signal; and means for detecting that the loop filter bandwidth is sufficiently narrow for said phase lock loop to acquire said transmitted signal, upon said monitored signal exceeding said upper threshold level, or detecting that the loop filter bandwidth width is not sufficiently narrow for said phase lock loop to acquire said transmitted signal upon said monitored signal being below said lower threshold level.

77. A receiver arrangement according to claim 76, wherein said second means further comprises:

means for detecting that said loop filter bandwidth is sufficiently narrow for said phase lock loop to acquire said transmitted signal upon said monitored signal being of a value between said upper and lower threshold levels for a prescribed period of time.

78. A receiver arrangement according to claim 77, wherein said second means further comprises:

means for adjusting said threshold levels in accordance with a prescribed reduction in the bandwidth of said carrier loop filter in response to said detecting means detecting that the loop filter bandwidth is not sufficiently narrow for said phase lock loop to acquire said transmitted signal.

79. A receiver arrangement according to claim 78, wherein said second means further comprises:

means for causing the operation of said comparing and reducing means to be repeated as necessary until one of said detecting means detects that the loop filter bandwidth is sufficiently narrow for said phase lock loop to acquire said transmitted signal.

80. A receiver arrangement according to claim 66, wherein said third means comprises:

means for sweeping said reference frequency, and thereby the center frequency to which said carrier loop filter is tuned, across said widest bandwidth determined by said third means; and means, responsive to said sweeping means having completed its sweep without said phase lock loop having acquired phase lock with said transmitted signal, for reducing the bandwidth of said carrier loop filter and causing said reference frequency to be swept and, if necessary, said bandwidth to be reduced, respectively, until phase lock is achieved.

81. A receiver arrangement according to claim 76, wherein said third means comprises:

means for sweeping said reference frequency, and thereby the center frequency to which said carrier loop filter is tuned, across said widest bandwidth determined by said third means; and means, responsive to said sweeping means having completed its sweep without said phase lock loop having acquired phase lock with said transmitted signal, for reducing the bandwidth of said carrier loop filter and causing said reference frequency to be swept and, if necessary, said bandwidth to be reduced, respectively, until phase lock is achieved.

82. A receiver arrangement according to claim 77, wherein said upper and lower thresholds are defined in accordance with the bandwidth of said carrier loop filter.

83. A receiver arrangement according to claim 78, wherein said upper and lower threshold levels are defined in accordance with the bandwidth of said carrier loop filter.

84. A receiver arrangement according to claim 80, wherein said third means further comprises:
 means for confining the sweep of said reference frequency to said range of frequency uncertainty.

85. A receiver arrangement according to claim 81, wherein said third means further comprises:
 means for confining the sweep of said reference frequency to said range of frequency uncertainty.

86. A receiver arrangement according to claim 80, further comprising:
 fourth means, coupled to said third means, and responsive to said phase lock loop acquiring phase lock, for converting the bandwidth of said carrier loop filter to a bandwidth corresponding to the data rate of said data to be recovered, whereby synchronization with said data and data recovery can be effected.

87. A receiver arrangement according to claim 81, further comprising:
 fourth means, coupled to said third means, and responsive to said phase lock loop acquiring phase lock, for converting the bandwidth of said carrier loop filter to a bandwidth corresponding to the data rate of said data to be recovered, whereby synchronization with said data and data recovery can be effected.

88. A receiver arrangement according to claim 67, wherein said first means further comprises means for causing said monitoring and detecting means to repeat their operations a plurality of times as a verification procedure, and thereafter generating an indication of whether or not the bin, the signal in which is being monitored, contains or does not contain a transmitted signal.

* * * * *